US012588500B2

(12) United States Patent
Mun et al.

(10) Patent No.: US 12,588,500 B2
(45) Date of Patent: Mar. 24, 2026

(54) SEMICONDUCTOR PACKAGE

(71) Applicant: SAMSUNG ELECTRONICS CO., LTD., Suwon-si (KR)

(72) Inventors: Kyungdon Mun, Asan-si (KR); Donghwa Kwak, Suwon-si (KR); Inho Roh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 525 days.

(21) Appl. No.: 18/069,957

(22) Filed: Dec. 21, 2022

(65) Prior Publication Data

US 2023/0197553 A1     Jun. 22, 2023

(30) Foreign Application Priority Data

Dec. 22, 2021     (KR) ........................ 10-2021-0185403

(51) Int. Cl.
*H01L 23/367*          (2006.01)
*H01L 23/00*           (2006.01)
(Continued)

(52) U.S. Cl.
CPC ........ *H01L 23/367* (2013.01); *H01L 23/3128* (2013.01); *H01L 23/528* (2013.01); *H01L 24/08* (2013.01); *H01L 24/09* (2013.01); *H01L 24/16* (2013.01); *H01L 24/17* (2013.01); *H01L 24/32* (2013.01); *H01L 24/33* (2013.01); *H01L 25/0657* (2013.01); *H01L 2224/08112* (2013.01); *H01L 2224/08113* (2013.01);
(Continued)

(58) Field of Classification Search
CPC . H01L 23/367; H01L 23/3128; H01L 23/528; H01L 24/08
See application file for complete search history.

(56) References Cited

U.S. PATENT DOCUMENTS 4,561,011 A * 12/1985 Kohara ............... H01L 23/4006
                                                         257/772
4,716,498 A * 12/1987 Ellis ..................... H05K 7/2049
                                                         361/715
(Continued)

FOREIGN PATENT DOCUMENTS

CN          1299993 A  *  6/2001   ........... H01L 23/367
CN     104025320 A  *  9/2014   ........... H10H 20/857
(Continued)

OTHER PUBLICATIONS

Office Action issued Oct. 16, 2025 in corresponding Korean Patent Application No. 10-2021-0185403 with English machine translation.

*Primary Examiner* — Laura M Menz
(74) *Attorney, Agent, or Firm* — Morgan, Lewis & Bockius LLP

(57) ABSTRACT

A semiconductor package includes a package substrate, a first semiconductor chip mounted on the package substrate and that includes a first semiconductor substrate that includes through electrodes, and a second semiconductor chip disposed on the first semiconductor chip and that includes a second semiconductor substrate that includes an active surface and an inactive surface. The second semiconductor chip further includes a plurality of isolated heat dissipation fins that extend in a vertical direction from the inactive surface.

9 Claims, 16 Drawing Sheets

(51) Int. Cl.

| | |
|---|---|
| *H01L 23/31* | (2006.01) |
| *H01L 23/528* | (2006.01) |
| *H01L 25/065* | (2023.01) |

(52) U.S. Cl.

CPC .............. *H01L 2224/09181* (2013.01); *H01L 2224/16148* (2013.01); *H01L 2224/16227* (2013.01); *H01L 2224/17181* (2013.01); *H01L 2224/32059* (2013.01); *H01L 2224/32113* (2013.01); *H01L 2224/32145* (2013.01); *H01L 2224/32227* (2013.01); *H01L 2224/33051* (2013.01); *H01L 2924/10161* (2013.01); *H01L 2924/141* (2013.01); *H01L 2924/1431* (2013.01); *H01L 2924/14335* (2013.01); *H01L 2924/1436* (2013.01); *H01L 2924/1437* (2013.01); *H01L 2924/1441* (2013.01); *H01L 2924/182* (2013.01)

(56) References Cited

U.S. PATENT DOCUMENTS

| | | | | |
|---|---|---|---|---|
| 4,771,365 A * | 9/1988 | Cichocki | ............. | H05K 7/1421 361/705 |
| 5,097,318 A * | 3/1992 | Tanaka | ............. | H01L 23/49822 257/722 |
| 5,157,588 A * | 10/1992 | Kim | ...................... | H01L 23/433 257/E23.09 |
| 5,199,164 A * | 4/1993 | Kim | ...................... | H01L 23/13 257/E23.09 |
| 5,297,001 A * | 3/1994 | Sterling | ............... | H01L 23/433 257/E23.09 |
| 5,533,256 A * | 7/1996 | Call | ..................... | H01L 23/642 174/16.3 |
| 5,552,637 A * | 9/1996 | Yamagata | ............. | H01L 23/147 257/E23.008 |
| 5,633,783 A * | 5/1997 | Yamamoto | .......... | H01L 25/0655 361/791 |
| 5,931,222 A * | 8/1999 | Toy | .......................... | F28F 3/02 361/708 |
| 6,009,938 A * | 1/2000 | Smith | ................. | H01L 23/3672 257/722 |
| 6,085,833 A * | 7/2000 | Kimura | ..................... | F28F 3/02 257/722 |
| 6,223,970 B1 * | 5/2001 | Chen | .................... | B23K 20/023 228/44.3 |
| 7,391,614 B2 * | 6/2008 | Artman | ................. | H01L 23/367 257/E23.102 |
| 7,919,845 B2 * | 4/2011 | Karp | ................... | H01L 25/0657 257/E21.705 |
| 8,526,186 B2 * | 9/2013 | Yokoya | ................... | H01L 23/50 174/16.3 |
| 8,692,282 B2 * | 4/2014 | Kim | ..................... | H05K 3/3426 257/99 |
| 8,823,041 B2 * | 9/2014 | Kim | .................. | H10H 20/8582 257/99 |
| 8,941,233 B1 * | 1/2015 | Ngai | ................. | H01L 21/76898 257/706 |
| 9,172,020 B2 * | 10/2015 | Kim | .................. | H10H 20/8582 |
| 9,613,881 B2 * | 4/2017 | Ahn | .................. | H01L 23/5226 |
| 9,721,868 B2 * | 8/2017 | Lin | ..................... | H10D 62/882 |
| 9,735,082 B2 * | 8/2017 | Hung | ................. | H01L 23/3677 |
| 10,062,665 B2 * | 8/2018 | Chen | ....................... | H01L 21/52 |
| 10,090,236 B2 * | 10/2018 | Jayasena | ............ | H01L 23/5386 |
| 10,276,544 B2 * | 4/2019 | Matsumoto | ............. | H01L 22/32 |
| 10,943,869 B2 * | 3/2021 | Zhai | ........................ | H01L 23/16 |
| 10,963,022 B2 * | 3/2021 | Steely, Jr. | ............... | H01L 25/18 |
| 11,031,394 B1 * | 6/2021 | Or-Bach | ................ | G06F 30/39 |
| 11,081,426 B2 * | 8/2021 | Mohamed | .............. | H01L 24/17 |
| 11,107,767 B2 * | 8/2021 | Kao | .................. | H01L 21/76883 |
| 2006/0027934 A1 * | 2/2006 | Edelstein | ............. | H01L 21/486 257/E21.597 |
| 2006/0187642 A1 * | 8/2006 | Jeong | ................. | H05K 7/20963 361/704 |
| 2006/0215367 A1 * | 9/2006 | Artman | ................. | H01L 23/367 257/E23.102 |
| 2011/0272692 A1 * | 11/2011 | Han | ........................ | H01L 25/18 257/E23.179 |
| 2013/0105851 A1 * | 5/2013 | Kim | ..................... | H10H 20/857 257/E33.066 |
| 2013/0107548 A1 * | 5/2013 | Kim | ................... | H10H 20/8582 257/E33.057 |
| 2013/0314877 A1 * | 11/2013 | Watanabe | ............ | H05K 1/0203 257/687 |
| 2014/0299910 A1 * | 10/2014 | Kim | ..................... | H10H 20/857 257/99 |
| 2015/0179617 A1 * | 6/2015 | Lin | ....................... | H10D 62/882 257/713 |
| 2017/0200716 A1 * | 7/2017 | Or-Bach | ............... | H01L 23/562 |
| 2017/0213821 A1 * | 7/2017 | Or-Bach | ................ | H01L 23/50 |
| 2018/0197812 A1 * | 7/2018 | Or-Bach | .......... | H01L 23/49838 |
| 2018/0226317 A1 * | 8/2018 | Shrivastava | ......... | H10D 84/834 |
| 2018/0277530 A1 * | 9/2018 | Or-Bach | ............... | H01L 21/304 |
| 2019/0006192 A1 * | 1/2019 | Or-Bach | ............ | H01L 23/5226 |
| 2019/0013213 A1 * | 1/2019 | Or-Bach | ............... | H10D 84/85 |
| 2019/0019693 A1 * | 1/2019 | Or-Bach | .......... | H01L 23/49827 |
| 2019/0385918 A1 * | 12/2019 | Choi | ..................... | H01L 22/34 |
| 2020/0373219 A1 * | 11/2020 | Hsu | .................... | H01L 23/3677 |
| 2021/0020457 A1 * | 1/2021 | Or-Bach | ............ | H01L 23/3677 |
| 2021/0043573 A1 * | 2/2021 | Eid | ......................... | H01L 24/29 |
| 2021/0118699 A1 * | 4/2021 | Or-Bach | ............ | H01L 23/3677 |
| 2021/0159139 A1 * | 5/2021 | Yu | ...................... | H01L 23/473 |
| 2021/0193655 A1 * | 6/2021 | Or-Bach | ........... | H10D 84/0149 |
| 2021/0225663 A1 * | 7/2021 | Or-Bach | ............. | H10D 84/038 |
| 2021/0225790 A1 * | 7/2021 | Chen | ...................... | H01L 25/50 |
| 2021/0242122 A1 * | 8/2021 | Jeng | ...................... | H01L 21/565 |
| 2023/0197553 A1 * | 6/2023 | Mun | ...................... | H01L 24/17 257/712 |
| 2024/0014283 A1 * | 1/2024 | Wang | .................... | H10D 84/83 |
| 2024/0096731 A1 * | 3/2024 | Wang | ................. | H01L 25/0655 |
| 2024/0162107 A1 * | 5/2024 | Huang | .................... | H01L 24/16 |
| 2024/0274523 A1 * | 8/2024 | Or-Bach | ............. | H10D 88/101 |
| 2025/0029886 A1 * | 1/2025 | Kang | .................. | H01L 25/0652 |

FOREIGN PATENT DOCUMENTS

| | | | | | |
|---|---|---|---|---|---|
| CN | 104025320 B | * | 10/2016 | .......... | H10H 20/857 |
| CN | 106169532 A | * | 11/2016 | .......... | H10H 20/857 |
| CN | 106169532 B | * | 7/2018 | .......... | H10H 20/857 |
| CN | 111446218 B | * | 3/2022 | ........ | H01L 23/3107 |
| CN | 116344468 A | * | 6/2023 | ........ | H01L 25/0657 |
| CN | 116978864 A | * | 10/2023 | .......... | H10D 84/853 |
| JP | 3726318 B2 | * | 12/2005 | ............ | H01L 24/97 |
| JP | 5444484 B1 | * | 3/2014 | | |
| KR | 20130046335 A | * | 5/2013 | .......... | H10H 20/857 |
| KR | 10-2019-0087718 A | | 7/2019 | | |
| KR | 10-2021-0100256 A | | 8/2021 | | |
| KR | 20230095685 A | * | 6/2023 | ........ | H01L 23/3677 |
| WO | WO-2013062289 A1 | * | 5/2013 | .......... | H10H 20/857 |
| WO | WO-2023286966 A1 | * | 1/2023 | .......... | H01L 23/367 |

* cited by examiner

SEMICONDUCTOR PACKAGE

CROSS-REFERENCE To RELATED APPLICATION

This application claims priority under 35 U.S.C. § 119 from Korean Patent Application No. 10-2021-0185403, filed on Dec. 22, 2021 in the Korean Intellectual Property Office, the contents of which are herein incorporated by reference in their entirety.

TECHNICAL FIELD

Embodiments of the inventive concept are directed to a semiconductor package, and more particularly, to a semiconductor package that includes a heat dissipation member.

DISCUSSION OF THE RELATED ART

Due to the demand for portable devices, electronic parts mounted in electronic products are being made smaller and lighter. To make electronic pans smaller and lighter, semiconductor packages mounted in the electronic parts are being gradually reduced in volume and process high capacity data. Thus, semiconductor chips mounted in a semiconductor package are highly integrated and single packaged. Therefore, a system in package (SiP) is used to efficiently arrange the semiconductor chips in a limited structure of a semiconductor package.

SUMMARY

Embodiments of the inventive concept are directed to a semiconductor package that has it heat dissipation characteristics and is more highly integrated by arranging a plurality of heat dissipation fins as heat dissipation members in an upper semiconductor chip in which a large amount of heat is generated.

According to an embodiment of the inventive concept, there is provided a semiconductor package that includes a package substrate, a first semiconductor chip mounted on the package substrate and that includes a first semiconductor substrate that includes through electrodes, and a second semiconductor chip disposed on the first semiconductor chip. The second semiconductor chip includes a second semiconductor substrate that include an active surface and an inactive surface, and the second semiconductor substrate includes a plurality of isolated heat dissipation fins that extend in a vertical direction from the inactive surface.

According to an embodiment of the inventive concept, there is provided a semiconductor package that includes a package substrate, a semiconductor chip stack mounted on the package substrate and that includes a plurality of semiconductor chips, and a molding member that surrounds the semiconductor chip stack. An uppermost semiconductor chip of the semiconductor chip stack includes a plurality of heat dissipation fins that have different lengths in a vertical direction. The remaining semiconductor chips in the semiconductor chip stack, excluding the uppermost semiconductor chip, include through electrodes, respectively.

According to an embodiment of the inventive concept, there is provided a semiconductor package that includes a package substrate, a first semiconductor chip mounted on the package substrate and that includes a first semiconductor substrate that includes a fin-shaped active area and a gate line that extends in a direction that intersects the fin-shaped active area, a second semiconductor chip disposed on the first semiconductor chip and that includes a second semiconductor substrate that includes a fin-shaped active area and a plurality of semiconductor patterns that are spaced apart from a top surface of the fin-shaped active area and that include a channel area, and a molding member that surrounds the first semiconductor chip and the second semiconductor chap on the package substrate. The first semiconductor chip includes through electrodes that penetrate through the first semiconductor substrate. The second semiconductor chip includes a plurality of isolated heat dissipation fins that extend in a vertical direction from the inactive surface of the second semiconductor substrate.

BRIEF DESCRIPTION OF THE DRAWINGS

FIG. 11 is a block diagram of an electronic device that includes a semiconductor package according to an embodiment of the inventive concept.

DETAILED DESCRIPTION

Hereinafter, embodiments of the inventive concept will be described in detail with reference to the accompanying drawings.

FIGS. 1A to 1D each illustrates a semiconductor package 10 according to an embodiment of the inventive concept.

Figure 1A:
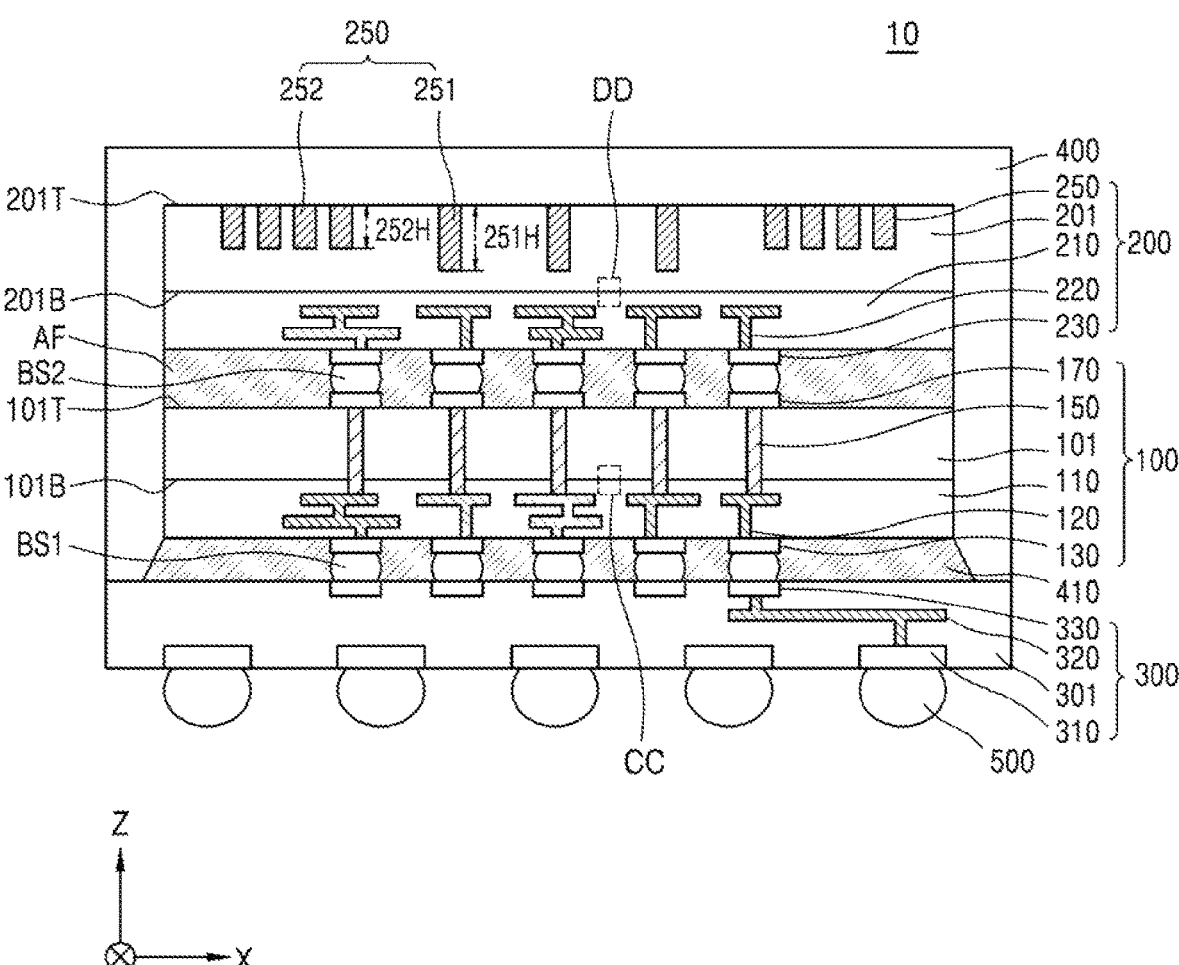
FIGS. 1A to 1D each illustrates a semiconductor package according to an embodiment of the inventive concept.
Figure 1B:
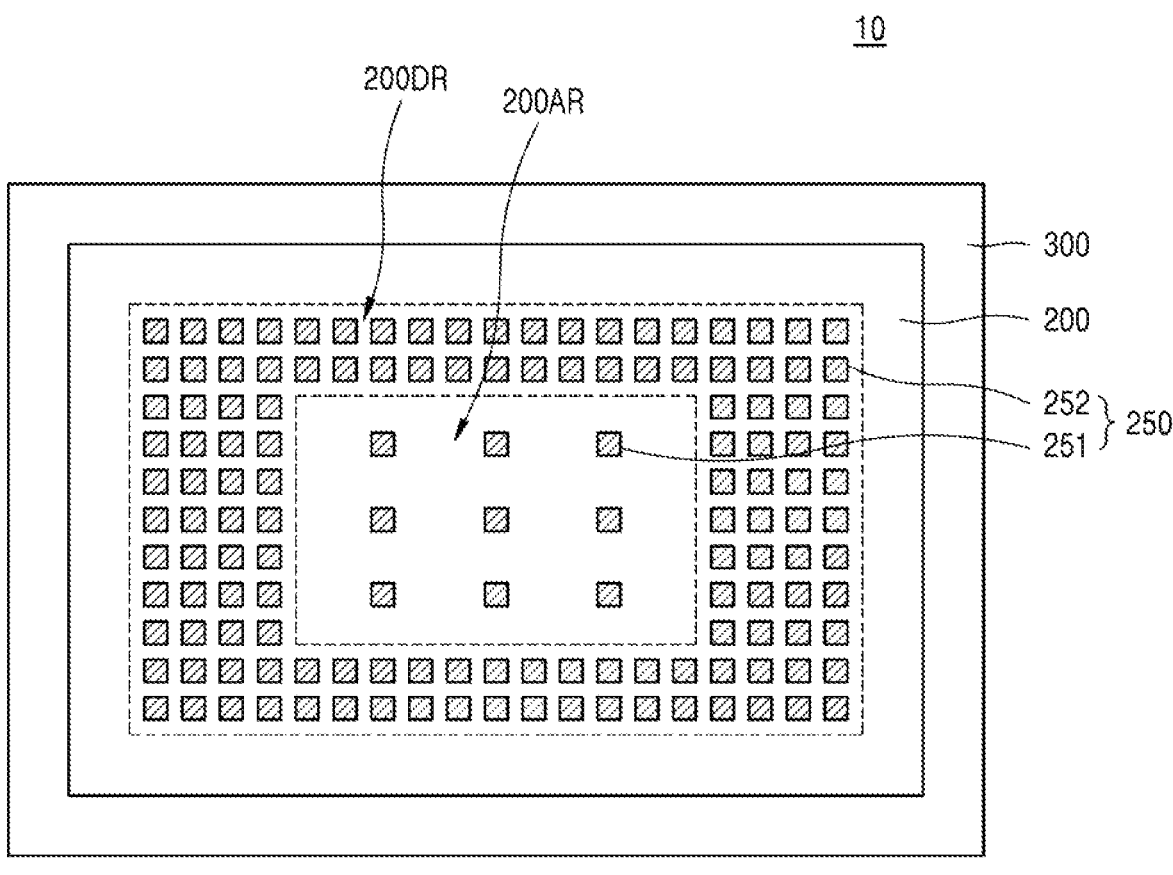
Figure 1B:
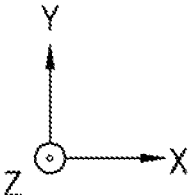
Figure 1C:
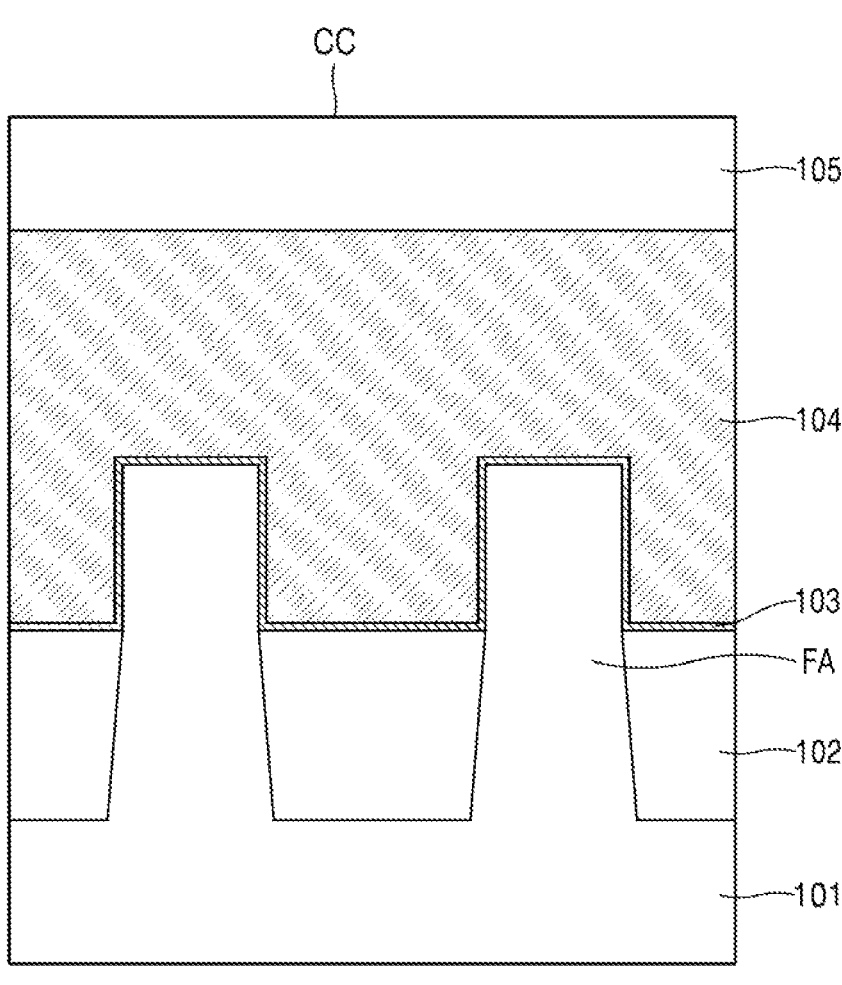
Figure 1C:
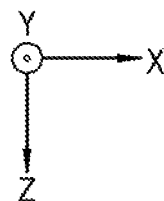
Figure 1D:
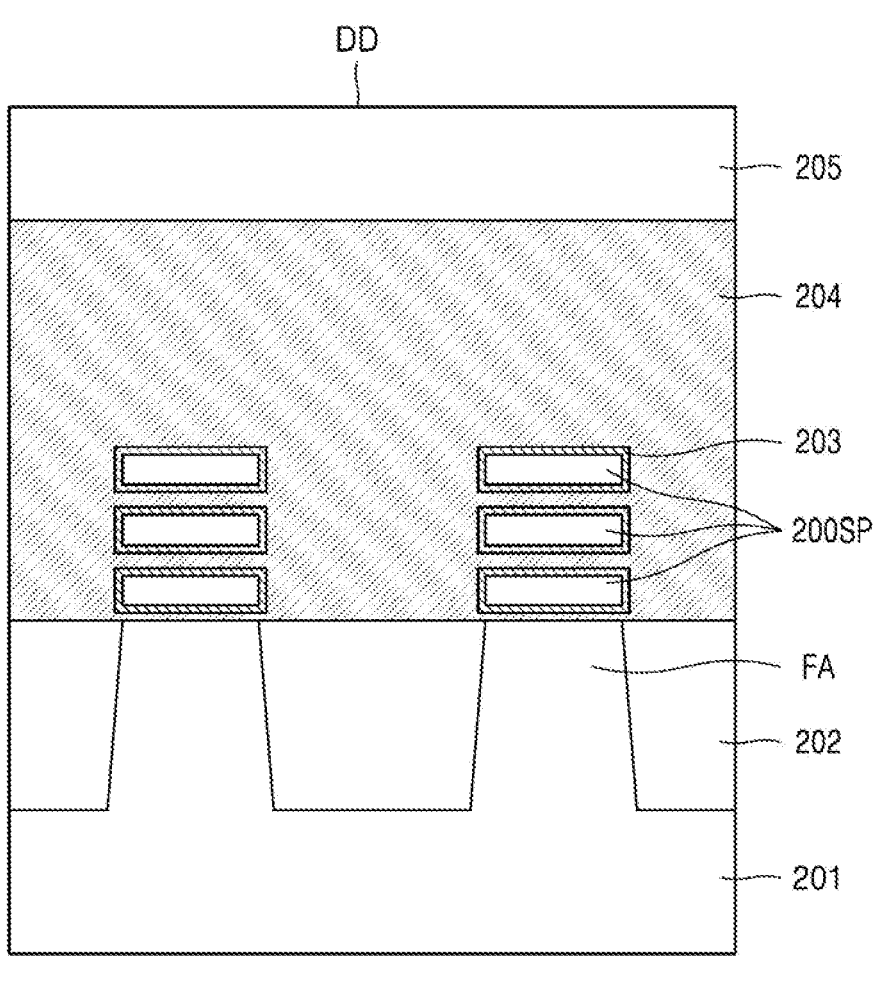
Figure 1D:
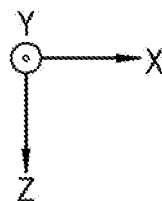

Specifically, FIG. 1A is a cross-sectional view of the semiconductor package 10, FIG. 1B is a plan view of the semiconductor package 10, FIG. 1C is an enlarged cross-sectional view of portion CC of FIG. 1A, and FIG. 1D is an enlarged cross-sectional view of portion DD of FIG. 1A. In addition, for convenience of illustration, in FIG. 1B a molding member 400 is illustrated as being transparent.

Referring to FIGS. 1A to 1D, in an embodiment, the semiconductor package 10 includes a first semiconductor chip 100, a second semiconductor chip 200, a package substrate 300, the molding member 400, and external connection terminals 500.

Each of the first and second semiconductor chips 100 and package 10 may be a logic chip or a memory chip. For example, both the first and second semiconductor chips 100 and 200 may be the same kind of memory chips, or one of the first and second semiconductor chips 100 and 200 may be a memory chip and the other may be a logic chip. In some embodiments, the first and second semiconductor chips 100 and 200 have a chiplet structure that includes a plurality of semiconductors.

The memory chip may be, for example, a volatile memory chip such as a dynamic random access memory (DRAM) or a static RAM (SRAM), or a non-volatile memory chip such as a phase-change RAM (PRAM), a magnetoresistive RAM (MRAM), a ferroelectric RAM (FeRAM), or a resistive RAM (RRAM). In addition, the logic chip may be, for example, one of a microprocessor, an analog device, or a digital signal processor.

The first semiconductor chip 100 includes a first substrate 101, a first semiconductor device layer 110, a first wiring layer 120, first bump pads 130, first through electrodes 150, and first upper pads 170.

The first substrate 101 is a semiconductor substrate and includes a top surface 101T and a bottom surface 101B that face each other. The top surface 101T may be referred to as an inactive surface and the bottom surface 101B may be referred to as an active surface. The first substrate 101 includes the first semiconductor device layer 110 formed on the bottom surface 101B and the first through electrodes 150 that penetrate the first substrate 101.

The first substrate 101 includes a silicon wafer that includes silicon (Si), such as at least one of crystalline silicon, polycrystalline silicon, or amorphous silicon. In an embodiment, the first substrate 101 includes a semiconductor element such as germanium (Ge) or a compound semiconductor such as one of silicon carbide (SiC), gallium arsenide (GaAs), indium arsenide (InAs), or indium phosphide (InP). In an embodiment, the first substrate 101 has a silicon on insulator (SOI) structure. For example, the first substrate 101 includes a buried oxide (BOX) layer. The first substrate 101 includes a conductive area, such as a well doped with impurities or a structure doped with impurities. In addition, the first substrate 101 includes one of various isolation structures such as a shallow trench isolation (STI) structure.

Specifically, as illustrated in FIG. 1C, in an embodiment, the first semiconductor chip 100 includes fin type field effect transistors. Fin type active areas FA protrude from a top surface of the first substrate 101. The fin type active areas PA are spaced apart from each other in a first horizontal direction (an X direction) that extends parallel with the top surface of the first substrate 101, and extend in a second horizontal direction (a Y direction) perpendicular to the first horizontal direction (the X direction) and that extends parallel with the top surface of the first substrate 101. Away from the top surface of the first substrate 101 in a vertical direction (a Z direction), a width of each of the fin type active areas PA decreases in the first horizontal direction (the X direction). That is, the fin type active areas FA have a trapezoidal shape on the first substrate 101.

Device isolation layers 102 cover lower portions of both side walls of each of the fin type active areas FA on the first substrate 101. Although not shown, interfacial films that conformally cover the side walls of each of the fin type active areas FA are further formed between the device isolation layers 102 and the fin type active areas FA.

A gate dielectric layer 103 covers top surfaces of the fin type active areas FA and upper portions of both side walls of each of the fin type active areas FA on the device isolation layers 102. A gate dielectric layer 103 is interposed between the gate electrode 104 and the fin type active areas FA and between the gate electrode 104 and top surfaces of the device isolation layers 102. The gate dielectric layer 103 extends on a bottom surface and side walls of the gate electrode 104 in the first horizontal direction (X direction). The gate dielectric layer 103 includes a high dielectric layer that has a dielectric constant higher than that of silicon oxide, silicon oxynitride, silicon nitride, or a combination of the above compound semiconductors. The high dielectric layer includes a metal oxide or a metal oxynitride.

An interlayer insulating layer 105 covers a top surface of the gate electrode 104. The interlayer insulating layer 105 includes at least one of silicon oxide, silicon oxynitride, or silicon nitride.

Source/drain regions are arranged in the fin type active areas FA on both sides of the gate electrode 104. The source/drain regions include, for example, at least one of doped silicon germanium (SiGe), doped Ge, doped silicon carbide (SiC), or doped indium gallium arsenide (InGaAs). However, embodiments of the inventive concept are not necessarily limited thereto.

The first semiconductor device layer 110 is disposed on the bottom surface 101B of the first substrate 101. The first semiconductor device layer 110 includes the first wiring layers 120 that connect a plurality of semiconductor devices to other wiring lines formed in the first substrate 101. The first wiring layer 120 include metal wiring layers and via plugs. For example, the first wiring layer 120 have a multilayer structure in which two or more metal wiring layers or two or more via plugs are alternately stacked.

The first bump pads 130 are disposed on the first semiconductor device layer 110 and are electrically connected to the first wiring layer 120 in the first semiconductor device layer 110. The first bump pads 130 are disposed on a lower surface of the first semiconductor device layer 110 that is opposite to an upper surface of the first semiconductor device layer 110 that faces the bottom surface 101B of the first substrate 101. The first bump pads 130 are electrically connected to the first through electrodes 150 through the first wiring layer 120. The first bump pads 130 include at least one of aluminum (Al), copper (Cu), nickel (Ni), tungsten (W), platinum (Pt), or gold (Au). However, embodiments of the inventive concept are not necessarily limited thereto.

In addition, a lower passivation layer is formed on the lower surface of the first semiconductor device layer 110. The lower passivation layer protects the first wiring layer 120 in the first semiconductor device layer 110 and other structures thereunder against external shock or moist. The lower passivation layer exposes top surfaces of the first bump pads 130.

The first through electrodes 150 penetrate the first substrate 101 from the top surface 101T of the first substrate 101 to the bottom surface 101B of the first substrate 101 in the vertical direction (the Z direction), and are connected to the first wiring layer 120 in the first semiconductor device layer 110. The first bump pads 130 are electrically connected to the first through electrodes 150 through the first wiring layer 120. At least some of the first through electrodes 150 are pillar-shaped. The first through electrodes 150 are through silicon vias (TSV).

First upper pads 170 that are electrically connected to the first through electrodes 150 are formed on the top surface 101T of the first substrate 101. The first upper pads 170 include substantially the same material as the first bump pads 130. In addition, an upper passivation layer surround parts of sides of the first upper pads 170 on the top surface 101T of the first substrate 101.

First bump structures BS1 that contact the first bump pads 130 are disposed under the first semiconductor device layer 110. The first bump structures BS1 electrically connect the semiconductor package 10 to the package substrate 300. Through the first bump structures BS1, the first semiconductor chip 100 receives at least one of a control signal, a power signal, or a ground signal for operating the first semiconductor chip 100, receives a data signal to be stored in the first semiconductor chip 100, or transmits data stored in the first semiconductor chip 100 to an external device. Each of the first bump structures BS1 has one of a pillar structure, a ball structure, or a solder layer.

The second semiconductor chip 200 is disposed on the first semiconductor chip 100. The second semiconductor chip 200 includes a second substrate 201, a second semiconductor device layer 210, a second wiring layer 220, second bump pads 230, and a plurality of heat dissipation fins 250. The second substrate 201 includes a top surface 201T and a bottom surface 201B that face each other. The second semiconductor chip 200 is disposed so that the bottom surface 201B of the second substrate 201 faces the top surface 101T of the first substrate 101. The top surface 201T of second substrate 201 may be referred to as an inactive surface and the bottom surface 201B thereof may be referred to as an active surface. The second semiconductor chip 200 is electrically connected to the first semiconductor chip 100 through second bump structures BS2 interposed between the first semiconductor chip 100 and the second semiconductor chip 200.

In addition, an adhesive film AF is interposed between the top surface 101T of the first semiconductor chip 100 and the bottom surface 201B of the second semiconductor chip 200 and attaches the second semiconductor chip 200 to the first semiconductor chip 100. As illustrated in FIG. 1A, the adhesive film AF directly contacts the first semiconductor chip 100 and the second semiconductor chip 200 and surrounds the second bump structures BS2. The adhesive film AF is a die attach film. A die attach film includes an inorganic adhesive and a polymer adhesive. The polymer adhesive includes a thermosetting resin and a thermoplastic resin and may include a hybrid resin obtained by mixing the above two components with each other.

Because the second semiconductor chip 200 has characteristics that are the same as or similar to those of the first semiconductor chip 100, description will be given based on differences with the first semiconductor chip 100.

As illustrated in FIG. 1D, in an embodiment, the second semiconductor chip 200 include a gate all around (GAA) field effect transistor (FET) or a transistor (such as an MBCFET® (a multibridge channel FET)) that includes a nano-sheet.

Fin type active areas FA protrude from a top surface of the second substrate 201. The fin type active areas FA are spaced apart from one another in the first horizontal direction (the X direction) that extends parallel with the top surface of the second substrate 201 and extend in the second horizontal direction (the Y direction) perpendicular to the first horizontal direction (the X direction) and parallel with the top surface of the second substrate 201. Device isolation layers 202 that define the fin type active areas FA are formed in the second substrate 201.

A plurality of semiconductor patterns 200SP are spaced apart from the second substrate 201 in the vertical direction (the Z direction) on the fin type active areas FA. The plurality of semiconductor patterns 200SP include the same material as the second substrate 201. For example, the plurality of semiconductor patterns 200SP include a semiconductor such as Si or Ge, or a compound semiconductor such as SiGe, SiC, GaAs, InAs, or InP. In addition, each of the plurality of semiconductor patterns 200SP includes a channel region.

Each of the plurality of semiconductor patterns 200SP has a large width in the first horizontal direction (the X direction) and a small thickness in the vertical direction (the Z direction) and is shaped as, for example, a nanosheet. In some embodiments, each of the plurality of semiconductor patterns 200SP has a width in a range of about 5 nm to about 100 nm in the first horizontal direction (the X direction) or the second horizontal direction (the Y direction). However, embodiments of the inventive concept are not necessarily limited thereto.

Gate dielectric layers 203 are interposed between a gate electrode 204 and the plurality of semiconductor patterns 200SP. The gate dielectric layers 203 are conformally formed on external walls of the plurality of semiconductor patterns 200SP. The gate electrode 204 extends on the fin type active areas FA and the device isolation layers 202 while surrounding the plurality of semiconductor patterns 200SP on the fin type active areas FA.

An interlayer insulating layer 205 covers a top surface of the gate electrode 204. The interlayer insulating layer 205 includes at least one of silicon oxide, silicon oxynitride, or silicon nitride.

Source/drain regions are formed in the fin type active areas FA on both sides of each of the plurality of semiconductor patterns 200SP and are connected to both ends of each of the plurality of semiconductor patterns 200SP.

The second semiconductor device layer 210 is formed on the active bottom surface 201B of the second semiconductor chip 200. The second bump pads 230 are disposed on the bottom surface of the second semiconductor device layer 210 and are electrically connected to the second wiring layer 220 in the second semiconductor device layer 210. The second bump pads 230 are electrically connected to the second semiconductor device layer 210 through the second wiring layer 220. The second bump pads 230 include substantially the same material as the first bump pads 130.

Second bump structures BS2 contact the second bump pads 230. Through the second bump structures BS2, the second semiconductor chip 200 receives at least one of a control signal, a power signal, or a ground signal for operating the second semiconductor chip 200, receives a data signal to be stored in the second semiconductor chip 200, or transmits data stored in the second semiconductor chip 200.

In the semiconductor package 10 according to an embodiment of the inventive concept, the second substrate 201 includes the plurality of isolated heat dissipation fins 250 in the second substrate 201 that extend in the vertical direction (the Z direction) from the top surface 201T of the second semiconductor chip 200. The plurality of heat dissipation fins 250 include first heat dissipation fins 251 and second heat dissipation fins 252 in accordance with their formation positions.

The plurality of heat dissipation fins 250 include a thermally conductive material. The plurality of heat dissipation fins 250 include substantially the same material as the first through electrodes 150 of the first semiconductor chip 100. Unlike the first through electrodes 150, each of the plurality of heat dissipation fins 250 electrically floats. The plurality of heat dissipation fins 250 include, for example, at least one of Cu, Al, titanium (Ti), tantalum (Ta), W, or Ni, or a combination of the above metals.

The plurality of heat dissipation fins 250 emit heat generated by the second semiconductor chip 200. For this purpose, top surfaces of the plurality of heat dissipation fins 250 are exposed from the second substrate 201. For example, a level of the top surface of each of the plurality of heat dissipation fins 250 is substantially coplanar with the inactive top surface 201T of the second substrate 201. The top surfaces of the plurality of heat dissipation fins 250 are square-shaped. For example, the plurality of heat dissipation fins 250 are square pillar-shaped.

Referring to FIG. 1B, in an embodiment, the second semiconductor chip 200 includes an active area 200AR in which active transistors are arranged and a dummy area 200DR in which dummy transistors are arranged. A first distribution density of first heat dissipation fins 251 in the active area 200AR is less than a second distribution density of second heat dissipation fins 252 in the dummy area 200DR.

In addition, a first length 251H in the vertical direction (the Z direction) of each of the first heat dissipation fins 251 in the active area 200AR is greater than a second length 252H in the vertical direction (the Z direction) of each of the second heat dissipation fins 252 in the dummy area 200DR. For example, a first vertical distance between each of the first heat dissipation fins 251 in the active area 200AR and each of the active transistors is less than a second vertical distance between each of the second heat dissipation fins 252 in the dummy area 200DR and each of the dummy transistors.

Therefore, heat generated by the active area 200AR is effectively emitted from the second semiconductor chip 200 through the first heat dissipation fins 251 and through the second heat dissipation fins 252 in the dummy area 200DR.

The package substrate 300 includes a substrate base 301, an upper protective layer, and a lower protective layer as a supporting substrate. The package substrate 300 includes one or more of a printed circuit board (PCB), a wafer substrate, a ceramic substrate, or a glass substrate. In the semiconductor package 10 according to the inventive concept, the package substrate 300 includes a PCB.

The external connection terminals 500 are disposed under lower electrode pads 310 that are disposed in a bottom surface of the package substrate 300. The semiconductor package 10 is electrically connected to and mounted in a module substrate or a system board of an electronic product through the external connection terminals 500, which will be described in detail below with reference to FIG. 11. In addition, a wiring line 320 is formed in the package substrate 300 and the wiring line 320 connects the lower electrode pads 310 to upper electrode pads 330 disposed in a top surface of the package substrate 300.

The wiring line 320 may have a multilayer or single layer structure formed in the substrate base 301, and the external connection terminals 500 are electrically connected to the first semiconductor chip 100 through the wiring line 320. The upper protective layer and the lower protective layer protect the substrate base 301, and include, for example, a solder resist.

When the package substrate 300 includes a PCB, the substrate base 301 is implemented by compressing a polymer material such as a thermosetting resin, an epoxy based resin such as flame retardant 4 (FR-4), bismaleimide triazine (BT), or ajinomoto build up film (ABF), or a phenol resin to a constant thickness, coating copper foil on both sides of the resin, and performing patterning to form the wiring line 320. Top and bottom surfaces of the substrate base 301, excluding the lower electrode pads 310 and the upper electrode pads 330, are coated with solder resist so that the upper protective layer and the lower protective layer can be implemented.

The PCB includes a single layer PCB on which the wiring line 320 is formed on one surface thereof, and a double layer PCB in which the wiring line 320 is formed on both surfaces thereof. In addition, three or more layers of copper foil are formed by using an insulator called prepreg and, by forming three or more wiring lines 320 in accordance with the number of layers of the copper foil, a multilayered PCB can be implemented. The package substrate 300 is not necessarily limited to the above-described structure or PCB material.

A molding member 400 is disposed on the first and second semiconductor chips 100 and 200 that protects the first and second semiconductor chips 100 and 200 against external influences such as contamination and shock. To perform this role, a thickness of the molding member 400 is determined so that the molding member 400 covers at least the first and second semiconductor chips 100 and 200. Because the molding member 400 covers all of the package substrate 300, a width of the molding member 400 is substantially equal to a width of the semiconductor package 10.

In addition, the molding member 400 includes, for example, an epoxy molding compound EMC). The molding member 400 may include one of various materials, such as an epoxy based material, a thermosetting material, a thermoplastic material, or an ultraviolet (UV) processing material without being limited to the EMC.

A proper amount of molding resin is implemented onto the package substrate 300 by an implantation process and an appearance of the semiconductor package 10 is formed by a hardening process. The appearance of the semiconductor package 10 is formed by applying pressure to the molding resin in a pressing process. Process conditions, such as delay time between implantation of the molding resin and pressure, an amount of the implanted molding resin, and pressurization temperature/pressure are set considering physical characteristics such as viscosity of the molding resin.

An underfill is formed between the first semiconductor chip 100 and the package substrate 300. A gap may be formed between the first semiconductor chip 100 and the package substrate 300. Because the gap can deteriorate connection reliability between the first semiconductor chip 100 and the package substrate 300, the underfill 410 is implanted to reinforce the connection between the first semiconductor chip 100 and the package substrate 300. In an embodiment, the underfill 410 is omitted and a molded underfill (MUF) process is used instead.

To make electronic parts mounted in electronic products smaller and lighter, the semiconductor package 10 mounted in each of the electronic parts has a reduced volume and can process high capacity data. The first and second semiconductor chips 100 and 200 mounted in the semiconductor package 10 are highly integrated and single packaged. Therefore, a system in package (SiP) is used to efficiently arrange the first and second semiconductor chips 100 and 200 in a limited structure of the semiconductor package 10. However, because a large amount of heat is commonly generated by the operations of a processor chip, chip performance can deteriorate unless generation of heat is controlled.

Therefore, in the semiconductor package 10 according to an embodiment of the inventive concept, by arranging the plurality of heat dissipation fins 250 as heat dissipation members in the second semiconductor chip 200, which generates a greater amount of heat than he first semiconductor chip 100, the semiconductor chips can be efficiently arranged in a limited spatial structure of the semiconductor package 10 and an environment is provided that is advantageous to heat emission characteristics and high integration.

Figure 2A:
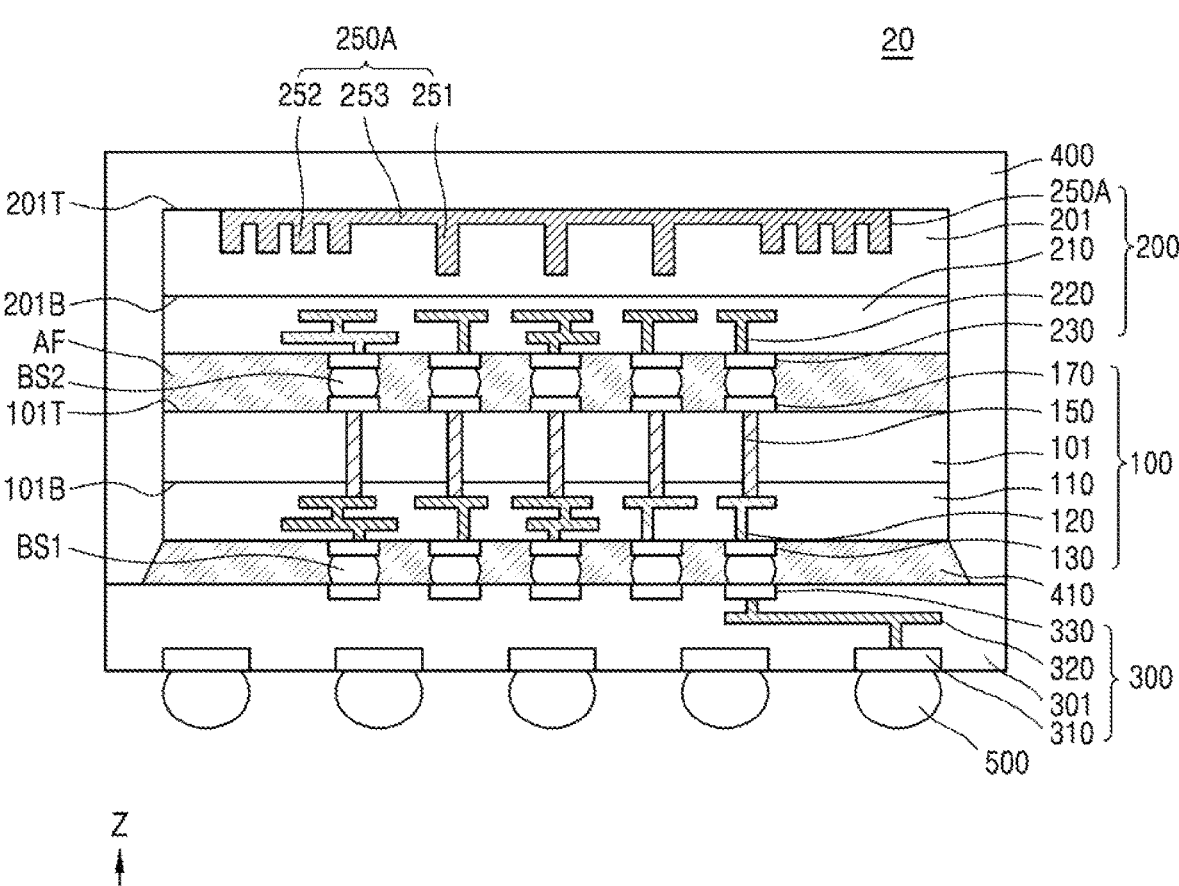
FIGS. 2A and 2B each illustrates a semiconductor package according to an embodiment of the inventive concept.
Figure 2A:
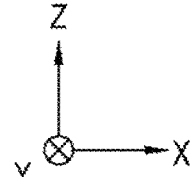
Figure 2B:
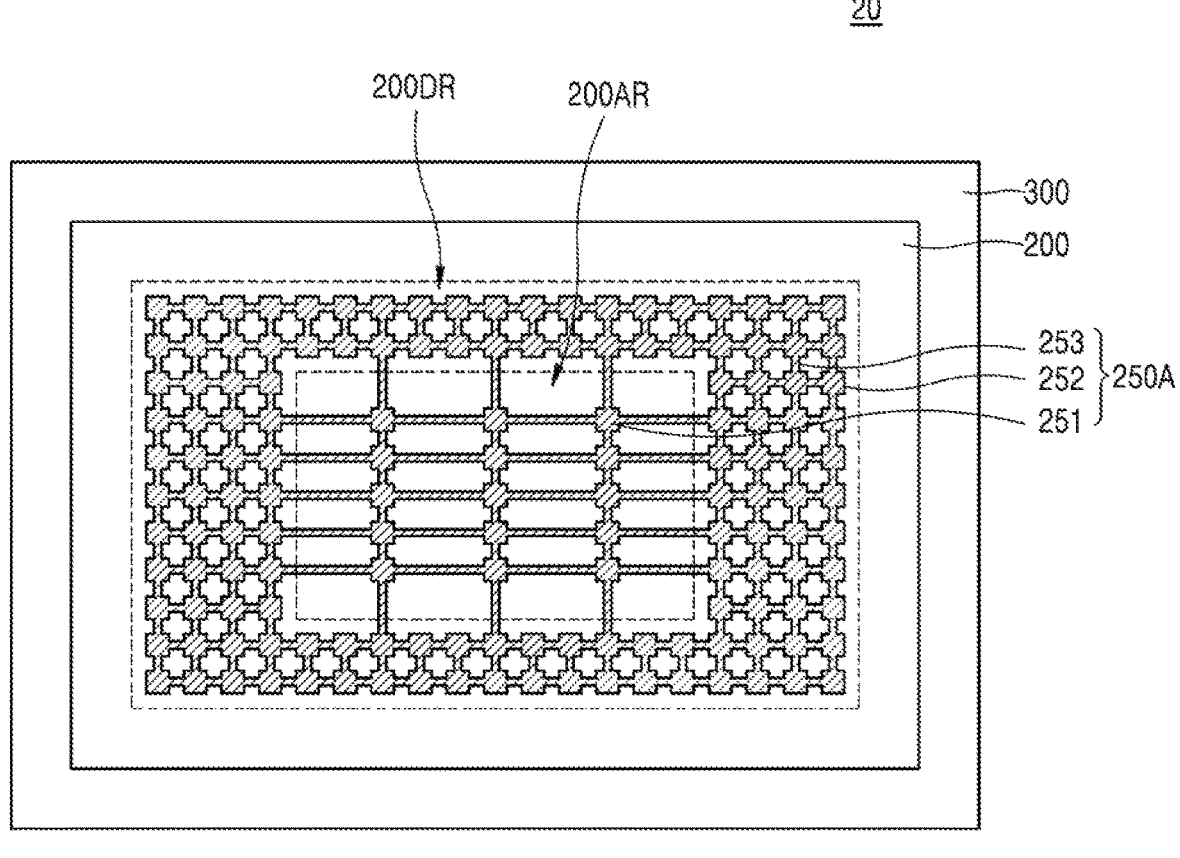
Figure 2B:
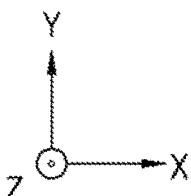

FIGS. 2A and 2B illustrate a semiconductor package 20 according to an embodiment of the inventive concept.

Specifically, FIG. 2A is a cross-sectional view of the semiconductor package 20 and FIG. 2B is a plan view of the semiconductor package 20. In addition, for convenience of illustration in FIG. 2B, a molding member 400 is illustrated as being transparent.

Most components that constitute the semiconductor package 20 described hereinafter and materials that constitute the below-described components are substantially the same as or similar to those described with reference to FIGS. 1A to 1D. Therefore, for convenience of description, descriptions will focus differences with the above-described semiconductor package 10.

Referring to FIGS. 2A and 2B, in an embodiment, the semiconductor package 20 includes a first semiconductor chip 100, a second semiconductor chip 200, a package substrate 300, a molding member 400, and external connection terminals 500.

In the semiconductor package 20 according to an embodiment, a second substrate 201 includes an isolated heat dissipation member 250A that extends in the vertical direction (the Z direction) from a top surface 201T of the second substrate 201. The heat dissipation member 250A includes first heat dissipation fins 251 and second heat dissipation fins 252 in accordance with formation positions and a heat dissipation bridge 253 that connects the first heat dissipation fins 251 to the second heat dissipation fins 252 in the first and second horizontal directions (the X and Y directions) in the form of a net.

The heat dissipation member 250A emits heat generated by the second semiconductor chip 200. A top surface of the heat dissipation member 250A is exposed from the second substrate 201. For example, a level of a top surface of the heat dissipation bridge 253 is substantially coplanar with the inactive top surface 201T of the second substrate 201.

The second semiconductor chip 200 includes an active area 200AR in which active transistors are arranged and a dummy area 200DR in which dummy transistors are arranged. A first distribution density of the first heat dissipation fins 251 in the active area 200AR is less than a second distribution density of the second heat dissipation fins 252 in the dummy area 200DR.

In addition, a first length in the vertical direction (the Z direction) of each of the first heat dissipation fins 251 in the active area 200AR is greater than a second length in the vertical direction (the Z direction) of each of the second heat dissipation fins 252 in the dummy area 200DR. For example, a first vertical distance between each of the first heat dissipation fins 251 in the active area 200AR and each of the active transistors is less than a second vertical distance between each of the second heat dissipation fins 252 in the dummy area 200DR and each of the dummy transistors.

Therefore, heat generated by the active area 200AR is effectively emitted from the second semiconductor chip 200 by the heat dissipation member 250A through the first heat dissipation fins 251 and the second heat dissipation fins 252 in the dummy area 200DR.

FIGS. 3 to 6 are cross-sectional views of semiconductor packages 30, 40, 50, and 60 according to embodiments of the inventive concept.

Most components that constitute the semiconductor packages 30, 40, 50, and 60 described hereinafter and materials that constitute the below-described components are substantially the same as or similar to those described with reference to FIGS. 1A to 1D. Therefore, for convenience of description, description will focus on differences with the above-described semiconductor package 10.

Figure 3:
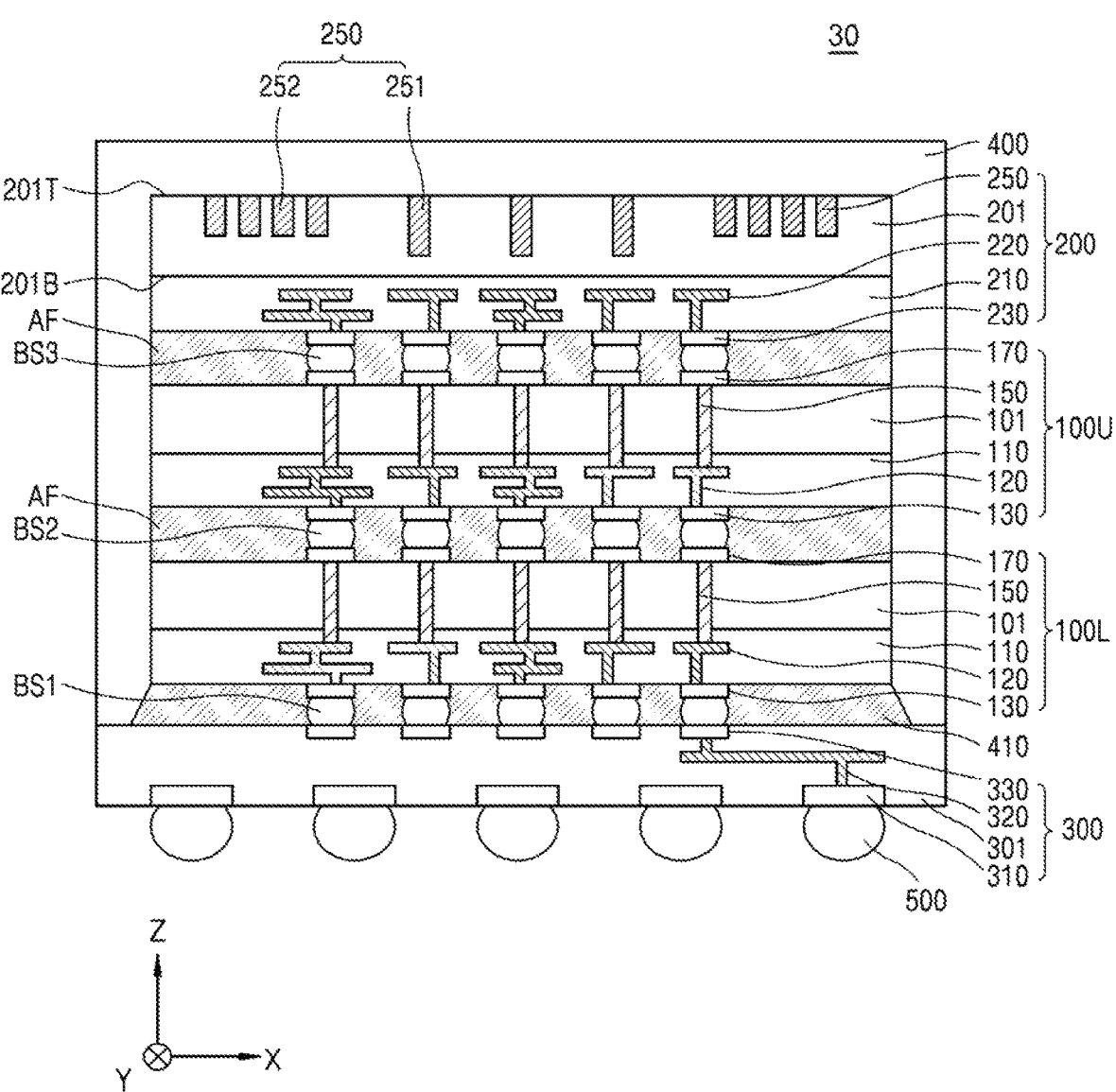
FIGS. 3 to 6 are cross-sectional views of semiconductor packages according to an embodiment of the inventive concept.

Referring to FIG. 3, in an embodiment, the semiconductor package 30 includes a first lower semiconductor chip 100L, a first upper semiconductor chip 100U, a second semiconductor chip 200, a package substrate 300, a molding member 400, and external connection terminals 500.

In the semiconductor package 30 according to an embodiment, each of the first lower semiconductor chip 100L, the first upper semiconductor chip 100U, and the second semiconductor chip 200 includes a high bandwidth memory (HBM) chip.

FIG. 3 shows that the first lower semiconductor chip 100L, the first upper semiconductor chip 100U, and the second semiconductor chip 200 of the semiconductor package 30 are stacked. However, the number of semiconductor chips stacked in the semiconductor package 30 is not necessarily limited thereto. For example, in some embodiments, four or more semiconductor chips are stacked in the semiconductor package 30.

The first lower semiconductor chip 100L and the first upper semiconductor chip 100U have substantially the same structure. However, the first lower semiconductor chip 100L is electrically connected to the package substrate 300 through first bump structures BS1 and the first upper semiconductor chip 100U is electrically connected to the first lower semiconductor chip 100L through second bump structures BS2.

The second semiconductor chip 200 is mounted on a top surface of the first upper semiconductor chip 100U. The second semiconductor chip 200 is electrically connected to the first upper semiconductor chip 100U through third bump structures BS3 interposed between the first upper semiconductor chip 100U and the second semiconductor chip 200.

In addition, an adhesive film AF that attaches the second semiconductor chip 200 to the first upper semiconductor chip 100U is interposed between the top surface of the first upper semiconductor chip 100U and a bottom surface of the second semiconductor chip 200. As illustrated in FIG. 3, the adhesive film AF directly contacts the first upper semiconductor chip 100U and the second semiconductor chip 200 and surrounds the third bump structures BS3.

In the semiconductor package 30 according to an embodiment of the inventive concept, a second substrate 201 of the second semiconductor chip 200 in the uppermost portion includes a plurality of isolated heat dissipation fins 250 that extend in the vertical direction (the Z direction) from a top surface 201T of the second semiconductor chip 200. The plurality of heat dissipation fins 250 include first heat dissipation fins 251 and second heat dissipation fins 252 in accordance with formation positions. Each of the first heat dissipation fins 251 has a length that differs from that of each of the second heat dissipation fins 252.

Figure 4:
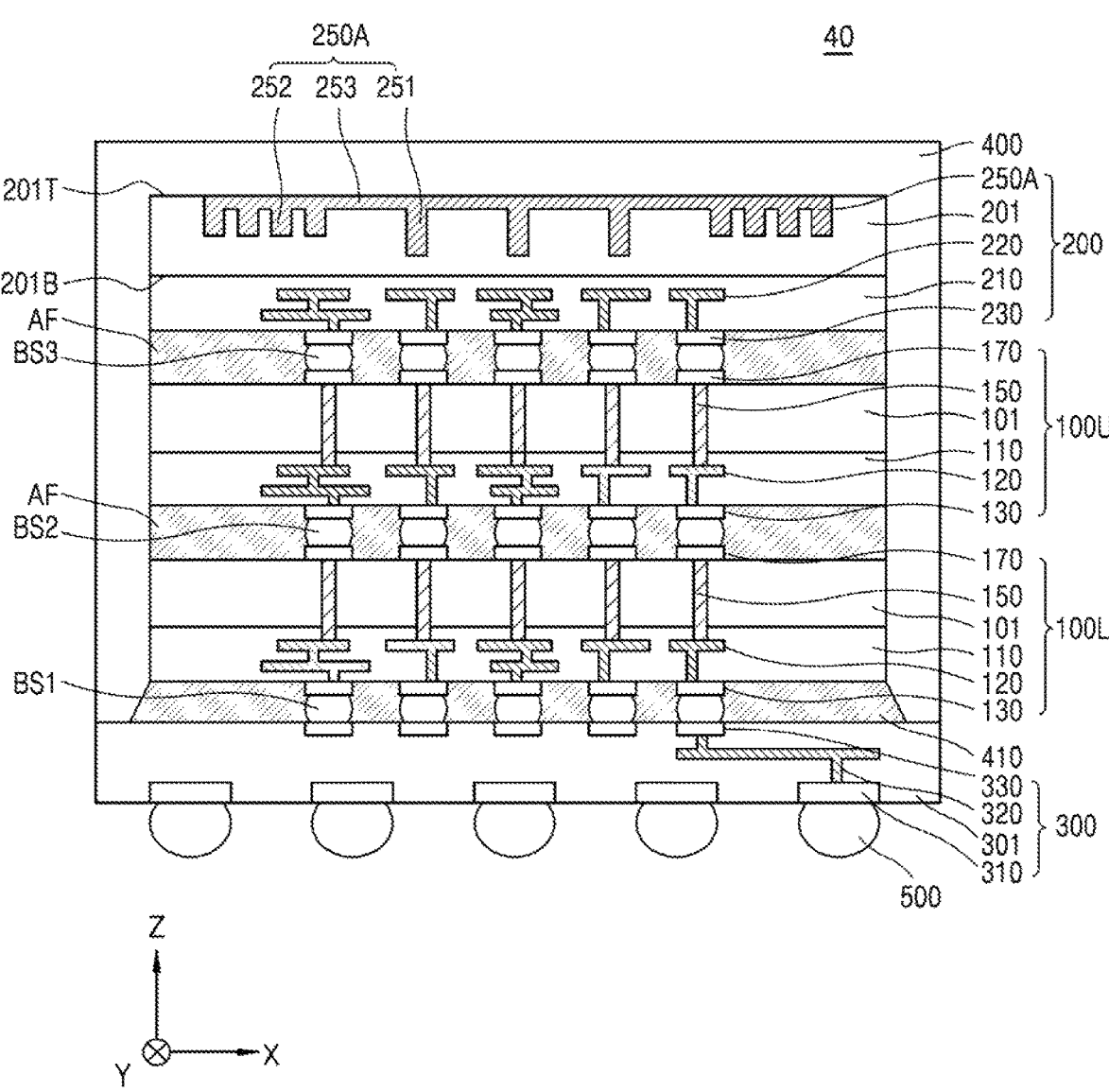

Referring to FIG. 4, in an embodiment, the semiconductor package 40 includes a first lower semiconductor chip 100L, a first upper semiconductor chip 100U, a second semiconductor chip 200, a package substrate 300, a molding member 400, and external connection terminals 500.

Components of the semiconductor package 40 according to an embodiment are substantially the same as those of the semiconductor package 30 of FIG. 3. Therefore, description will focus differences with the semiconductor package 30 of FIG. 3.

A second substrate 201 of the second semiconductor chip 200 in the uppermost portion includes an isolated heat dissipation member 250A that extends in the vertical direction (the Z direction) from a top surface 201T of the second semiconductor chip 200. The heat dissipation member 250A includes first heat dissipation fins 251 and second heat dissipation fins 252 in accordance with formation positions and a heat dissipation bridge 253 that connects the first heat dissipation fins 251 to the second heat dissipation fins 252 in the first and second horizontal directions (the X and Y directions) in the form of a net.

The heat dissipation member 250A emits heat generated by the second semiconductor chip 200. For this purpose, a top surface of the heat dissipation member 250A is exposed from the second substrate 201. For example, a level of a top surface of the beat dissipation bridge 253 is substantially coplanar with the inactive top surface 201T of the second substrate 201.

Figure 5:
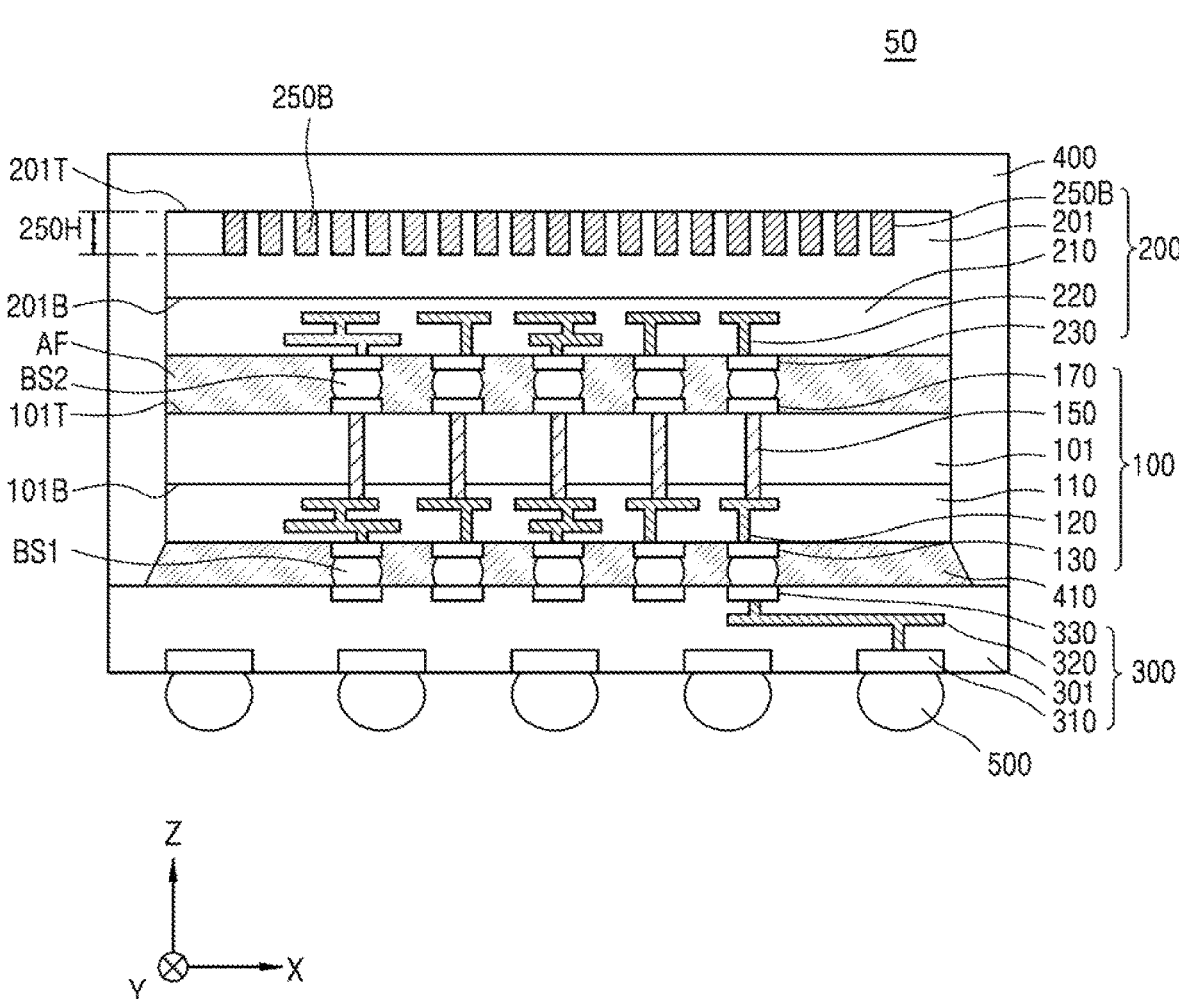

Referring to FIG. 5, in an embodiment, the semiconductor package 50 includes a first semiconductor chip 100, a second semiconductor chip 200, a package substrate 300, a molding member 400, and external connection terminals 500.

In the semiconductor package 50 according to an embodiment, a second substrate 201 includes a plurality of isolated heat dissipation members 250B that extend in the vertical direction (the Z direction) from a top surface 201T of the second semiconductor chip 200.

The plurality of heat dissipation fins 250B emit heat generated by the second semiconductor chip 200. For this purpose, top surfaces of the plurality of beat dissipation tins 250B are exposed from the second substrate 201. For example, a level of the top surface of each of the plurality of heat dissipation tins 250B is substantially coplanar with the inactive top surface 201T of the second substrate 201.

The second semiconductor chip 200 includes an active area in which active transistors are arranged and a dummy area in which dummy transistors are arranged. The plurality of heat dissipation fins 250B in the active area and the dummy area have substantially the same distribution density.

In addition, the plurality of heat dissipation fins 250B in the active area and the dummy area have substantially the same length 250H in the vertical direction the Z direction). For example, a vertical distance between each of the plurality of heat dissipation fins 250B in the active area and each of the active transistors is substantially equal to a vertical distance between each of the plurality of heat dissipation fins 250B in the dummy area and each of the dummy transistors.

Figure 6:
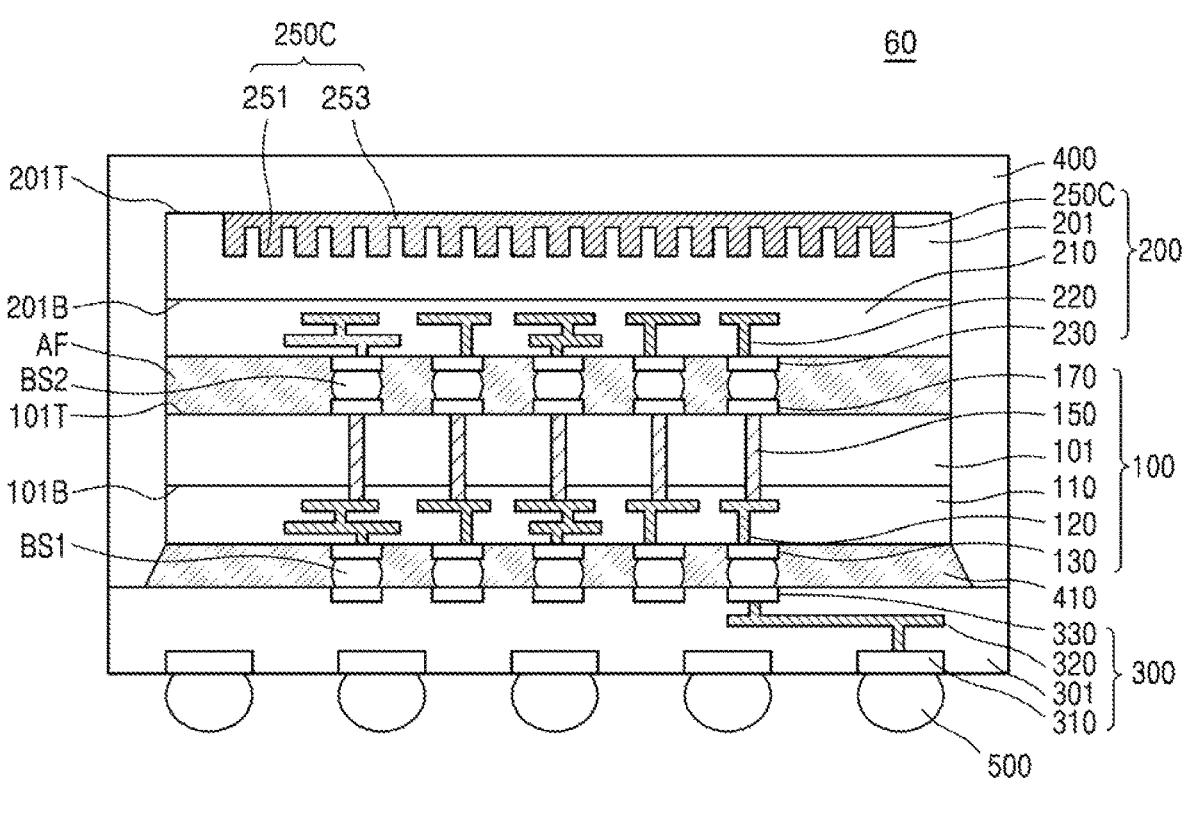
Figure 6:
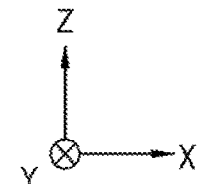

Referring to FIG. 6, in an embodiment, the semiconductor package 60 includes a first semiconductor chip 100, a second semiconductor chip 200, a package substrate 300, a molding member 400, and external connection terminals 500.

In the semiconductor package 60 according to an embodiment, a second substrate 201 includes an isolated heat dissipation member 250C that extends in the vertical direction (the Z direction) from a top surface 201T of the second semiconductor chip 200.

The heat dissipation member 2500 includes a plurality of first heat dissipation fins 251 that have the same shape regardless of formation positions and a heat dissipation bridge 253 that connect the plurality of first heat dissipation fins 251 to each other in the first and second horizontal directions (the X and Y directions) in the form of a net.

The heat dissipation member 250C emits heat generated by the second semiconductor chip 200. For this purpose, a top surface of the heat dissipation member 250C is exposed from the second substrate 201. For example, a level of a top surface of the heat dissipation bridge 253 is substantially coplanar with the inactive top surface 201T of the second substrate 201.

The second semiconductor chip 200 includes an active area in which active transistors are arranged and a dummy area in which dummy transistors are arranged. The plurality of first heat dissipation fins 251 in the active area and the dummy area have substantially the same distribution density.

In addition, the plurality of first heat dissipation fins 251 in the active area and the dummy area have substantially the same length in the vertical direction (the Z direction). For example, a vertical distance between each of the first heat dissipation fins 251 in the active area and each of the active transistors is substantially equal to a vertical distance between each of the first heat dissipation fins 251 and each of the dummy transistors.

FIGS. 7 to 10 are plan views of semiconductor packages 70, 80, 90, and 95 according, to embodiments of the inventive concept.

Most components that constitute the semiconductor packages 70, 80, 90, and 95 described hereinafter and materials that constitute the below-described components are substantially the same as or similar to those described with reference to FIGS. 1A to 1D. Therefore, for convenience of description, description will focus on differences with the above-described semiconductor package 10.

Figure 7:
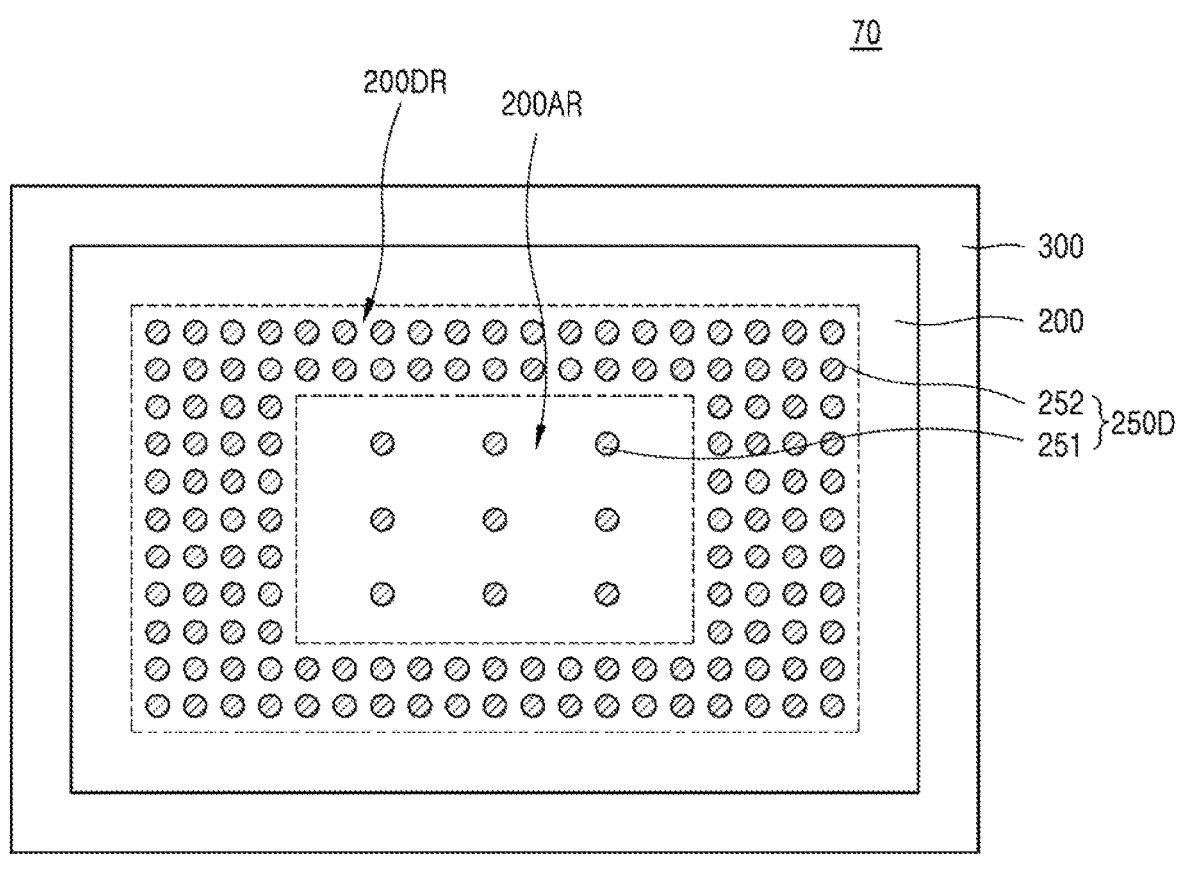
FIGS. 7 to 10 are plan views of semiconductor packages according to an embodiment of the inventive concept.
Figure 7:
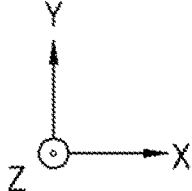

Referring to FIG. 7, in an embodiment, the semiconductor package 70 includes a first semiconductor chip, a second semiconductor chip 200, a package substrate 300, a molding member, and external connection terminals.

In the semiconductor package 70 according to an embodiment, the second semiconductor chip 200 includes a plurality of isolated heat dissipation fins 250D that extend in the vertical direction (the Z direction) from a top surface of the second semiconductor chip 200. The plurality of heat dissipation fins 250D include first heat dissipation fins 251 and second heat dissipation fins 252 in accordance with formation positions.

The plurality of heat dissipation fins 250D emit heat generated by the second semiconductor chip 200. For this purpose, top surfaces of the plurality of heat dissipation fins 250D are exposed from the second semiconductor chip 200. In an embodiment, the top surfaces of the plurality of heat dissipation fins 250D are circular. For example, the plurality of heat dissipation fins 250D are cylindrical. In an embodiment, the top surfaces of the plurality of heat dissipation fins 250D are polygonal. For example, the plurality of heat dissipation fins 250D have a polygonal-pillar shape.

Figure 8:
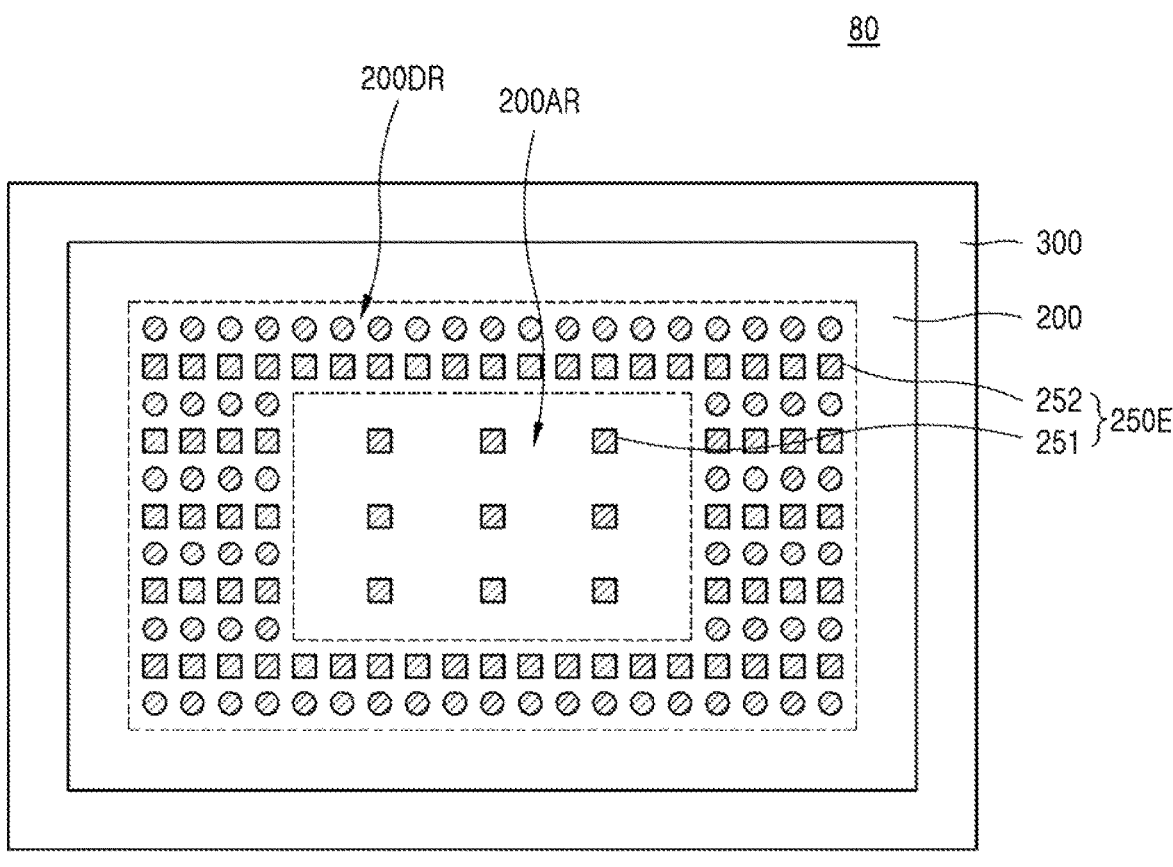
Figure 8:
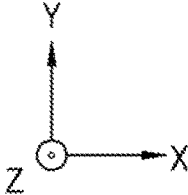

Referring to FIG. 8, in an embodiment, the semiconductor package 80 includes a first semiconductor chip, a second semiconductor chip 200, a package substrate 300, a molding member, and external connection terminals.

In the semiconductor package 80 according to an embodiment, the second semiconductor chip 200 includes a plurality of isolated heat dissipation fins 250E that extend in the vertical direction (the Z direction) from a top surface of the second semiconductor chip 200. The plurality of heat dissipation fins 250E include first heat dissipation fins 251 and second heat dissipation fins 252 in accordance with formation positions.

The plurality of heat dissipation fins 250E emit heat generated by the second semiconductor chip 200. For this purpose, top surfaces of the plurality of heat dissipation fins 250E are exposed from the second semiconductor chip 200. For example, the top surfaces of the plurality of heat dissipation fins 250E are alternately circular and square-shaped. For example, rows of the plurality of heat dissipation fins 250E alternately have a cylindrical or a square pillar shape.

Figure 9:
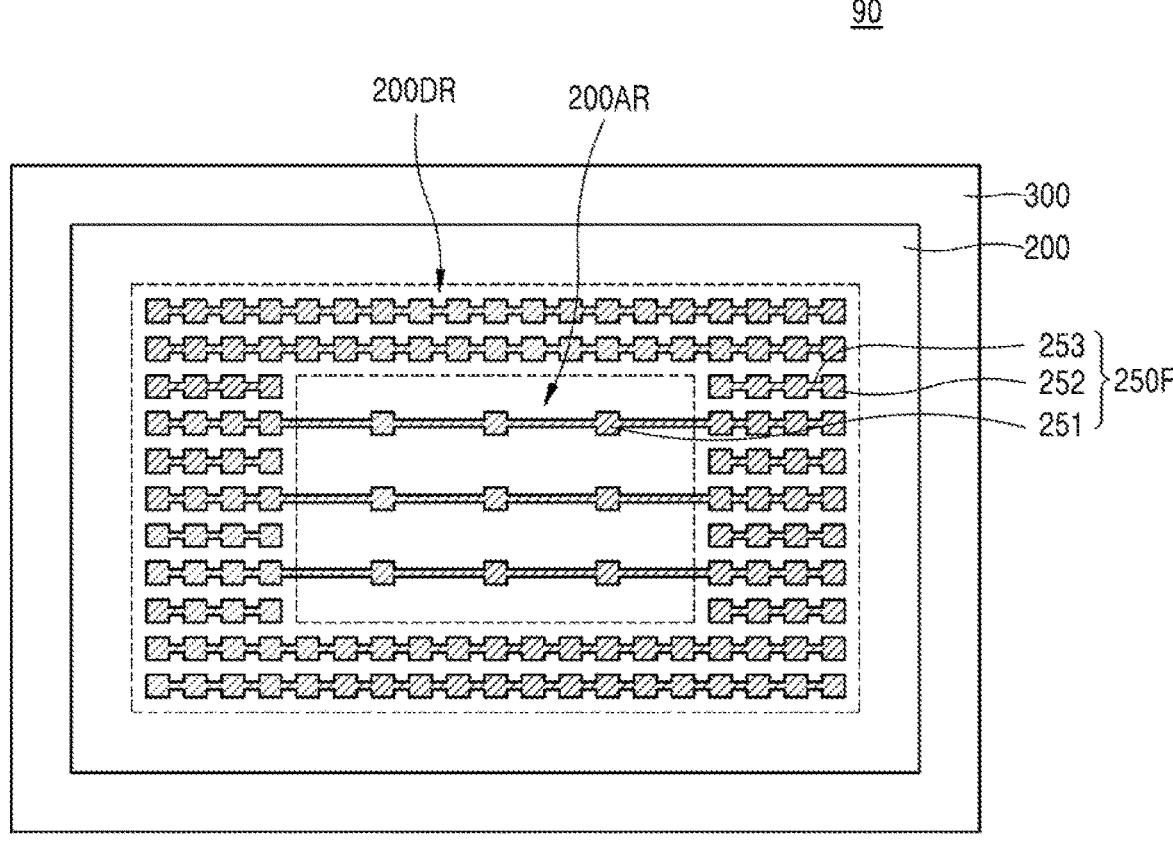
Figure 9:
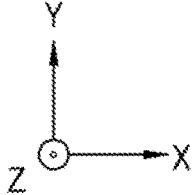

Referring to FIG. 9, in an embodiment, the semiconductor package 90 includes a first semiconductor chip, a second semiconductor chip 200, a package substrate 300, a molding member, and external connection terminals.

In the semiconductor package 90 according to an embodiment, the second semiconductor chip 200 includes an isolated heat dissipation member 250F that extends in the vertical direction (the Z direction) from a top surface of the second semiconductor chip 200. The heat dissipation member 250F includes first heat dissipation fins 251 and second heat dissipation fins 252 in accordance with formation positions, and a heat dissipation bridge 253 that connects the first heat dissipation fins 251 to the second heat dissipation fins 252 in the form of a straight line that extends in one of the first or second horizontal directions (the X and Y directions).

The heat dissipation member 250F emits heat generated by the second semiconductor chip 200. For this purpose, a top surface of the heat dissipation bridge 253 is exposed from the second semiconductor chip 200.

Figure 10:
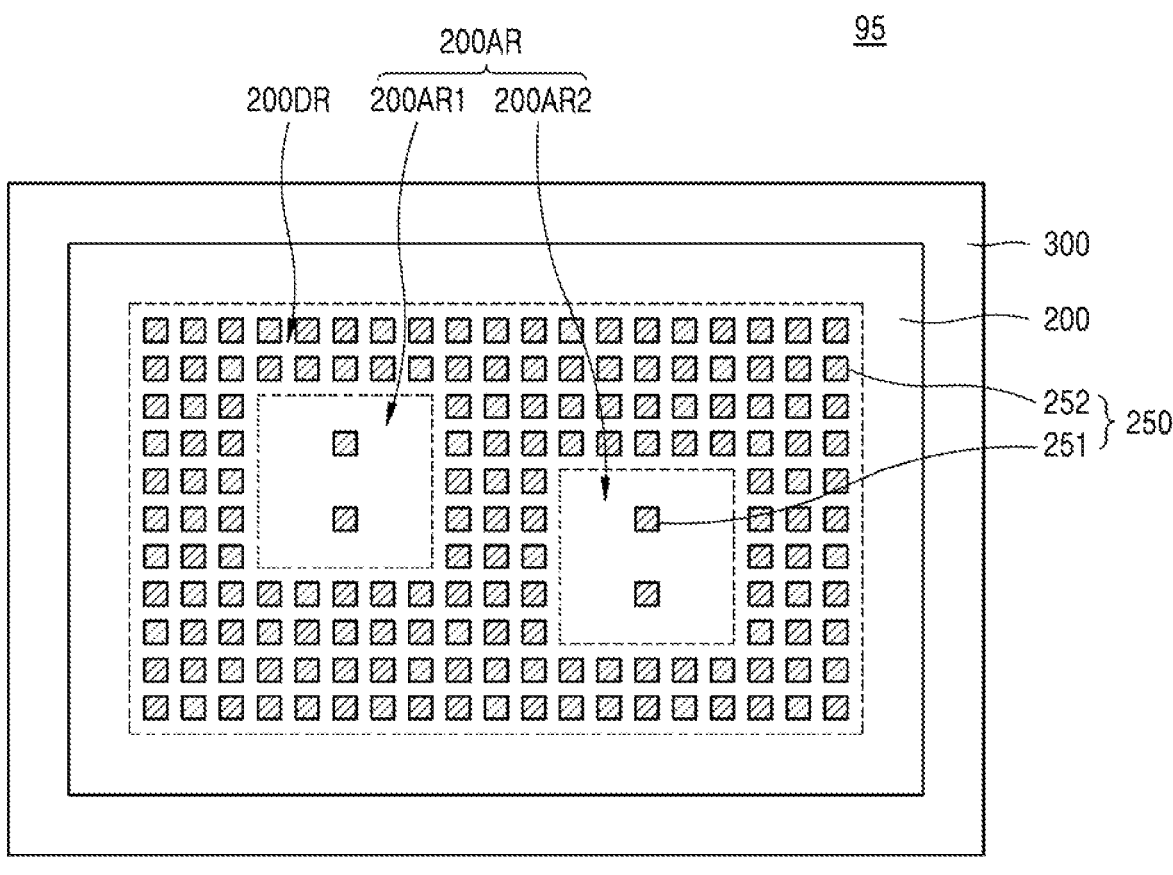
Figure 10:
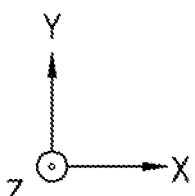

Referring to FIG. 10, in an embodiment, the semiconductor package 95 includes a first semiconductor chip, a second semiconductor chip 200, a package substrate 300, a molding member, and external connection terminals.

In the semiconductor package 95 according to an embodiment, an active area 200AR of the second semiconductor chip 200 includes a first active area 200AR1 and a second active area 200AR2 that are apart from each other.

The second semiconductor chip 200 includes an active area 200AR in which active transistors are arranged and a dummy area 200DR in which dummy transistors are arranged. A first distribution density of the first heat dissipation fins 251 in the active area 200AR is less than a second distribution density of the second heat dissipation fins 252 in the dummy area 200DR.

The first active area 200AR1 and the second active area 200AR2 are spaced apart from each other with the center point of the top surface of the second semiconductor chip 200 therebetween. In addition, the first active area 200AR1 and the second active area 200AR2 are diagonally offset from each other in the top surface of the second semiconductor chip 200. However, embodiments of the inventive concept are not necessarily limited thereto.

Figure 11:
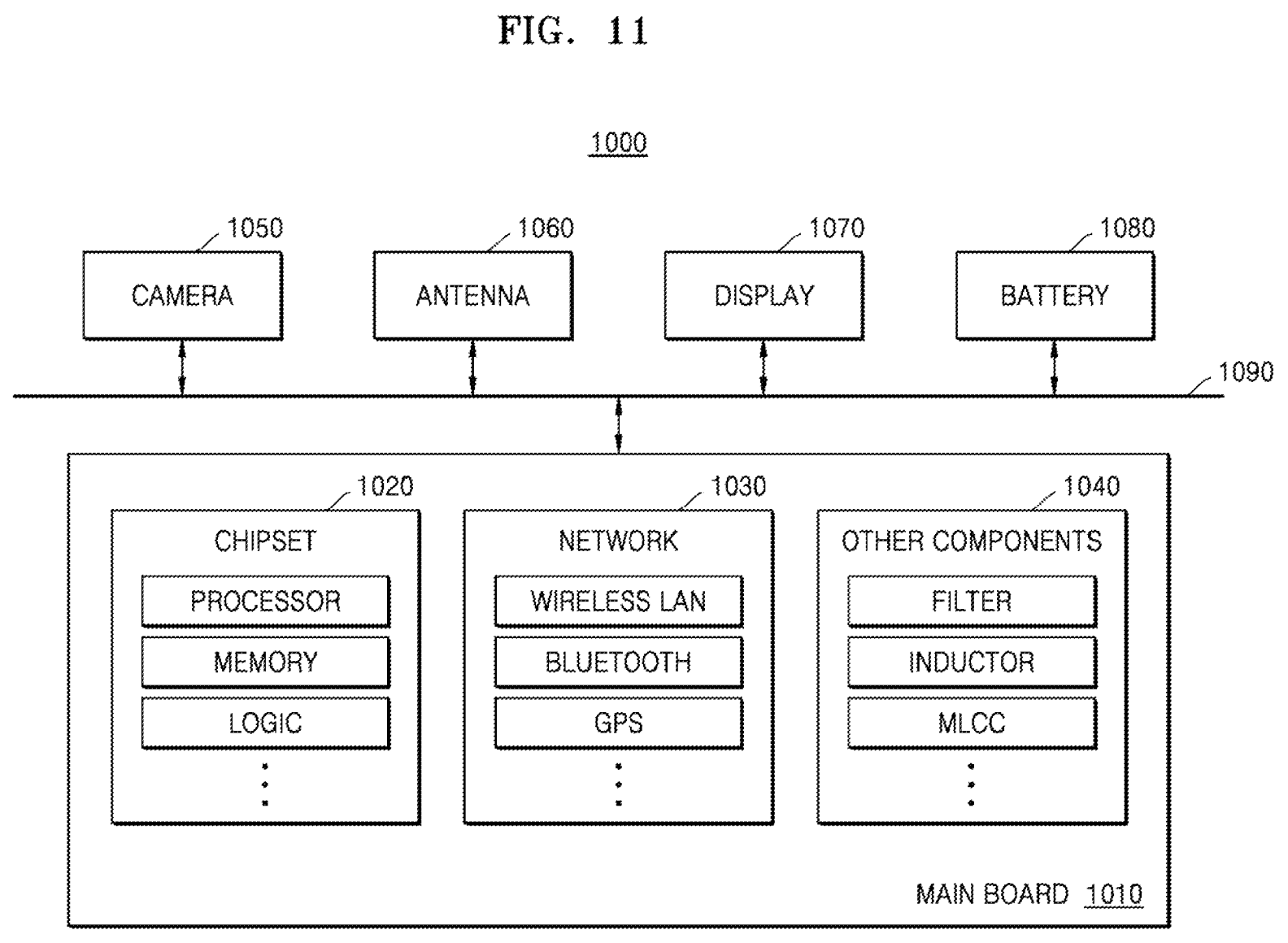

FIG. 11 is a block diagram of an electronic device 1000 that includes a semiconductor package according to an embodiment of the inventive concept.

Referring to FIG. 11, in an embodiment, the electronic device 1000 accommodates a main board 1010. A chipset 1020, a network 1030, and other components 1040 are physically and/or electrically connected to the main board 1010. The chipset 1020, the network 1030, and the other components 1040 are also combined with other electronic components described below to form various signal lines 1090.

The chipset 1020 includes a memory chip such as volatile memory, non-volatile memory, or flash memory, an application processor chip such as a central processor, a graphics processor, a digital signal processor, an encryption processor, a microprocessor, or a microcontroller, and a logic chip such as an analog-to-digital (AD) converter or an application-specific integrated circuit (ASIC). In addition, other forms of chip related electronic components may be included. In addition, the components of the chipset 1020 may be combined with one another.

The network 1030 may be one of a WiFi (IEEE 802.11 family, etc.), a WiMAX (IEEE 802.16 family, etc.), an IEEE 802.20, a long term evolution (LTE), an Ev-DO, an HSPA+, an HSDPA+, an HSUPA+, an EDGE, a GPS, a GPRS, a CDMA, a TDMA, a DECT, a Bluetooth, a 3G, a 4G, a 5G, or any other wired/wireless protocols designated as follows. In addition, any of a plurality of other wired/wireless standards and protocols may be included. In addition, the network 1030 may be combined with the chipset 1020.

The other components 1040 include a high frequency inductor, a ferrite inductor, a power inductor, ferrite beads, low temperature co-firing ceramics (LTCC), an electromagnetic interference (EMI) filter, and/or a multi-layer ceramic condenser (MLCC). In addition, a manual component that is used for various other purposes may be included. In addition, the other components 1040 may be combined with the chipset 1020 and/or the network 1030.

In accordance with the type of the electronic device 1000, the electronic device 1000 may include other electronic components that may be or may not be physically and/or electrically connected to the main board 1010. The other electronic components may include, for example, a camera 1050, an antenna 1060, a display 1070, a battery 1080, an audio codec, a video codec, a power amplifier, a compass, an accelerometer, a gyroscope, a speaker, a bulk storage, a compact disk (CD), and/or a digital versatile disk (DVD). In addition, in accordance with the type of the electronic device 1000, electronic components that are used for various purposes may be included.

The electronic device 1000 may be a smartphone, a personal digital assistant (PDA), a digital video camera, a digital still camera, a network system, a computer, a monitor, a tablet, a laptop computer, a netbook, a television, a video game, or a smart watch. The electronic device 1000 may include any other electronic device that processes data.

The semiconductor packages 10, 20, 30, 40, 50, 60, 70, 80, 90, and 95 according to embodiments of the inventive concept described with reference to FIGS. 1A to 10 are incorporated into the electronic device 1000 for various purposes.

Figure 12:
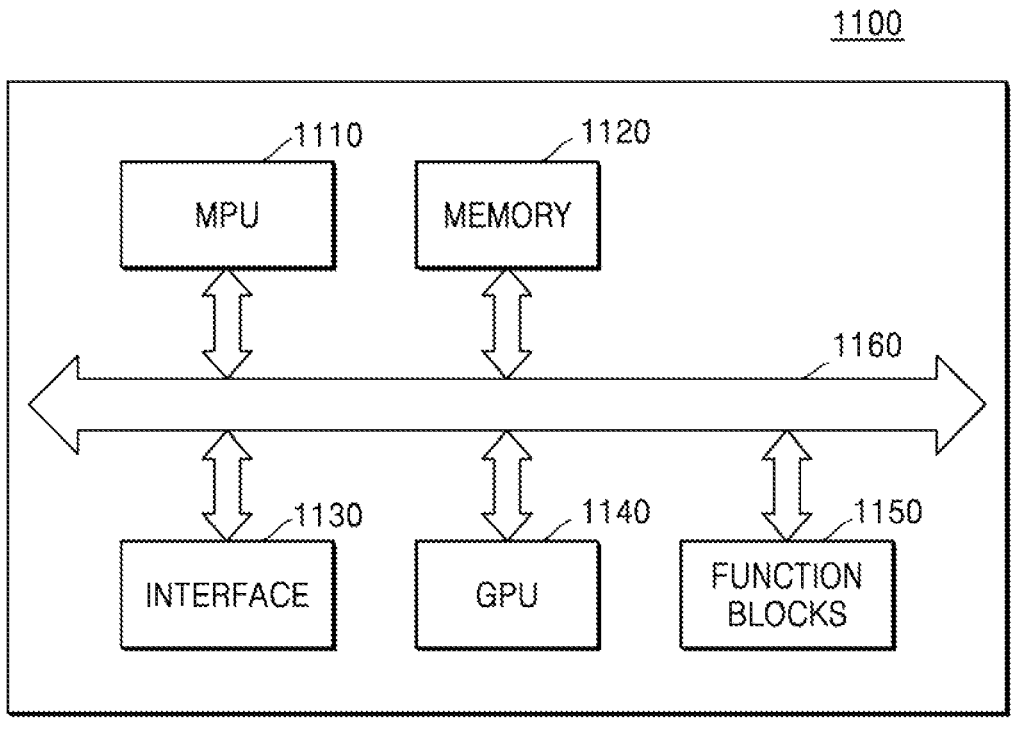
FIG. 12 is a block diagram of a semiconductor package according to an embodiment of inventive concept.

FIG. 12 is a block diagram of a semiconductor package 1100 according to an embodiment of the inventive concept.

Referring to FIG. 12, in an embodiment, the semiconductor package 1100 include a micro-processing unit (MPU) 1110, a memory 1120, an interface 1130, a graphics processing unit (GPU) 1140, function blocks 1150, and a bus 1160 connecting the above components to one another.

The semiconductor package 1100 may include both the MPU 1110 and the GPU 1140 or may include only one of the MPU 1110 or the GPU 1140.

The MPU 1110 may include a core and a cache. For example, the MPU 1110 may include a multicore. Cores of a multicore may have the same performance or different performances. In addition, the cores of a multicore may be simultaneously activated or may be activated at different times.

The memory 1120 stores a result processed by the function blocks 1150 under control of the MPU 1110. The interface 1130 exchanges information or signals with external devices. The GPU 1140 performs graphics functions. For example, the GPU 1140 can perform a video codec or process 3D graphics. The function blocks 1150 perform various functions. For example, when the semiconductor package 1100 is an application processor for a mobile device, some of the function blocks 1150 perform a communication function.

The semiconductor package 1100 includes one of the semiconductor packages 10, 20, 30, 40, 50, 60, 70, 80, 90, and 95 according to embodiments of the inventive concept described with reference to FIGS. 1A to 10.

While embodiments of the inventive concept have been particularly shown and described with reference to the figures, it will be understood that various changes in form and details may be made therein without departing from the spirit and scope of the following claims.

What is claimed is:

1. A semiconductor package, comprising:

a package substrate;

US 12,588,500 B2

15 a first semiconductor chip mourned on the package sub-
strate, wherein the first semiconductor chip includes a
first semiconductor substrate that includes through
electrodes; and
a second semiconductor chip disposed on the first semi-
conductor chip, wherein the second semiconductor chip
includes a second semiconductor substrate that
includes an active surface and an inactive surface, and
the second semiconductor substrate includes a plurality
of isolated heat dissipation fins that extend from the
inactive surface in a vertical direction,
wherein the second semiconductor chip comprises an
active area in which active transistors are arranged and
a dummy area in which dummy transistors are
arranged, and
wherein a first distribution density of the plurality of heat
dissipation fins in the active area is less than a second
distribution density of the plurality of heat dissipation
fins in the dummy area.
2. The semiconductor package of claim 1, wherein a first
length in the vertical direction of each of the plurality of heat
dissipation fins in the active area is greater than a second
length in the vertical direction of each of the plurality of heat
dissipation fins in the dummy area.
3. The semiconductor package of claim 2, wherein a first
vertical distance between each of the plurality of heat
dissipation fins in the active area and each of the active
transistors is less than a second vertical distance between
each of the plurality of heat dissipation fins in the dummy
area and each of the dummy transistors.
4. The semiconductor package of claim 1, wherein upper
portions of the plurality of heat dissipation fins are con-
nected in horizontal directions to a heat dissipation bridge in
a form of a net, and

wherein a level of a top surface of the heat dissipation
bridge is substantially coplanar with the inactive sur-
face of the second semiconductor substrate.
5. The semiconductor package of claim 4, wherein heat
generated by the active area is emitted from the second
semiconductor chip through the plurality of heat dissipation
fins in the dummy area.
6. The semiconductor package of claim 1, wherein upper
portions of the plurality of heat dissipation fins are con-
nected to a heat dissipation bridge in a form of a straight line
that extends in one of horizontal directions, and
wherein a level of a top surface of the heat dissipation
bridge is substantially coplanar with the inactive sur-
face of the second semiconductor substrate.
7. The semiconductor package of claim 1, wherein the
first semiconductor chip comprises through electrodes that
penetrate through the first semiconductor substrate.
8. The semiconductor package of claim 7, wherein the
plurality of heat dissipation fins include substantially a same
material as the through electrodes,
wherein each of the plurality of heat dissipation fins
electrically floats, and
wherein the through electrodes electrically connect the
first semiconductor chip to the second semiconductor
chip.
9. The semiconductor package of claim 1, wherein a first
transistor in the first semiconductor chip is a fin-shaped field
effect transistor (FET), and
wherein a second transistor in the second semiconductor
chip is a gate all around (GAA)-shaped FET.

* * * * *